United States Patent
Yamane et al.

(10) Patent No.: US 8,913,349 B2
(45) Date of Patent: Dec. 16, 2014

(54) CPP-TYPE MAGNETORESISTANCE EFFECT ELEMENT AND MAGNETIC DISK DEVICE USING SIDE SHIELD LAYERS

(71) Applicant: TDK Corporation, Tokyo (JP)

(72) Inventors: Takekazu Yamane, Tokyo (JP); Takahiko Machita, Tokyo (JP); Naomichi Degawa, Tokyo (JP); Minoru Ota, Tokyo (JP); Kenta Hamamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/853,869

(22) Filed: Mar. 29, 2013

(65) Prior Publication Data

US 2014/0293474 A1    Oct. 2, 2014

(51) Int. Cl.
*G11B 5/39* (2006.01)
*H01L 43/08* (2006.01)
(52) U.S. Cl.
CPC .............. *G11B 5/3932* (2013.01); *H01L 43/08* (2013.01)
USPC ....................................... 360/319; 360/324.1
(58) Field of Classification Search
USPC ............ 360/319, 322, 324.1, 324.11, 324.12, 360/324.2
See application file for complete search history.

(56) References Cited

U.S. PATENT DOCUMENTS

| | | | | |
|---|---|---|---|---|
| 7,876,534 | B2* | 1/2011 | Chou et al. | 360/319 |
| 8,559,140 | B2* | 10/2013 | Gao | 360/324.12 |
| 2009/0073616 | A1* | 3/2009 | Shimazawa et al. | 360/319 |
| 2009/0135529 | A1 | 5/2009 | Shimazawa et al. | |
| 2010/0232074 | A1* | 9/2010 | Machita et al. | 360/324.11 |
| 2011/0051291 | A1* | 3/2011 | Miyauchi et al. | 360/245.3 |
| 2012/0063035 | A1* | 3/2012 | Childress et al. | 360/319 |
| 2012/0250189 | A1* | 10/2012 | Degawa et al. | 360/235.4 |
| 2013/0128390 | A1* | 5/2013 | Qiu et al. | 360/324.11 |

* cited by examiner

*Primary Examiner* — Jefferson Evans
(74) *Attorney, Agent, or Firm* — Posz Law Group, PLC

(57) ABSTRACT

An MR element includes an MR part and upper and lower shield layers in a CPP structure. The MR element has side shield layers so as to interpose the MR part between the side shield layers in a track width direction. The MR part comprises a nonmagnetic intermediate layer and first and second ferromagnetic layers so as to interpose the nonmagnetic intermediate layer between the ferromagnetic layers. Each of the upper and lower shield layers has an inclined magnetization structure such that its magnetization is inclined relative to the track width direction. The side shield layers are magnetically coupled with the upper shield layer, respectively. The second ferromagnetic layer is indirectly magnetically coupled with the lower shield layer via an exchange-coupling functional gap layer. The side shield layer applies a bias magnetic field to the first ferromagnetic layer; and magnetizations of the first and second ferromagnetic layers are substantially orthogonal.

12 Claims, 17 Drawing Sheets

CPP-TYPE MAGNETORESISTANCE EFFECT ELEMENT AND MAGNETIC DISK DEVICE USING SIDE SHIELD LAYERS

BACKGROUND OF THE INVENTION

1. Field of the Invention

The present invention relates to a magnetoresistive effect element (MR element) for reading magnetic field intensity of a magnetic recording medium as a signal, a thin film magnetic head including the MR element, a head gimbal assembly (HGA) and a magnetic disk apparatus.

2. Description of the Related Art

Recently, in association with high recording density of a hard disk (HDD), improvement of performance of the thin film magnetic head is in demand. As the thin film magnetic head, a composite-type thin film magnetic head with a structure where a reproducing head having the MR element exclusive for reading and a recording head having an induction-type magnetic transduction element exclusive for writing are laminated is widely used.

At present, as the reproducing head, an MR element with a so-called current-in-plane structure (CIP-GMR element) that is activated by applying an electric current on a film surface of the element in parallel, referred to as a spin-valve GMR element, is widely used. The spin-valve GMR element with such structure, in the reproducing head, is positioned between upper and lower shield layers made of a soft magnetic metal film, and, is arranged in a form interposed by an insulating layer referred to as a gap layer from top and bottom. The recording density in the bit direction is determined by a space (reproducing gap space) of the upper and lower shield layers.

In association with the increase of the recording density, demands for a narrower shield gap and a narrower track in a reproducing element of the reproducing head have become stronger. Because of the narrower track of the reproducing element and shortening of the element height in association with this, an area of the element is reduced, but because a heat dissipation efficiency is decreased with the conventional structure in association with the reduction of the area, there is a problem that an operating current is restricted from a viewpoint of reliability.

In order to solve such problem, a GMR element with a Current-Perpendicular-to-Plane (CPP) structure (CPP-GMR element) where the upper and lower shield layers (upper shield layer and lower shield layer) and the MR element are electrically connected in series is proposed, and in order to accomplish the recording density exceeding 200 Gbits/in$^2$, this is referred to as an essential technology.

Such CPP-GMR element has a lamination structure including a first ferromagnetic layer and a second ferromagnetic layer formed so as to interpose a conductive nonmagnetic intermediate layer from both sides. The lamination structure of a typical spin-valve type CPP-GMR element is a lamination structure where a lower electrode/an antiferromagnetic layer/a lower ferromagnetic layer/a conductive nonmagnetic intermediate layer/an upper ferromagnetic layer/an upper electrode are sequentially laminated from the substrate side.

The magnetization direction of the lower ferromagnetic layer, which is one of the ferromagnetic layers, is pinned so as to be perpendicular to that of the upper ferromagnetic layer when an external application magnetic field is zero. The magnetization direction of the lower ferromagnetic layer is pinned by adjoining the antiferromagnetic layer and by applying a unidirectional anisotropy energy (also referred to as "exchange bias" or "coupling magnetic field") to the lower ferromagnetic layer due to exchange coupling between the antiferromagnetic layer and the lower ferromagnetic layer. Consequently, the lower ferromagnetic layer is also referred to as a magnetization pinned layer. In the meantime, the upper ferromagnetic layer is also referred to as a free layer. In addition, it is also proposed that the magnetization pinned layer (lower ferromagnetic layer) has a three-layer structure (so-called "synthetic ferromagnetic (SyF) structure" or "synthetic pinned structure") with a ferromagnetic layer/a nonmagnetic metallic layer/a ferromagnetic layer, as well. With this design, strong exchange coupling is provided between two ferromagnetic layers of the magnetization pinned layer (lower ferromagnetic layer), and exchange-coupling force from the antiferromagnetic layer can be effectively increased, and in addition, it becomes possible to reduce an effect of a static magnetic field generated from the magnetization pinned layer on a free layer. Consequently, this "synthetic pinned structure" is widely used at present.

However, in order to respond to the demand for recent ultrahigh recording density, it has become necessary to further reduce the thickness of a layer of the MR element. Under such circumstances, for example, a new GMR element structure having a simple three-layer lamination structure with a ferromagnetic layer/an nonmagnetic intermediate layer/a ferromagnetic layer as disclosed, for example, in U.S. Pat. Nos. 7,019,371B2 and 7,035,062B1, as a basic structure is proposed. In this GMR element structure, as shown in FIG. 22, two ferromagnetic layers 401 and 402 are exchange-coupled so as to have their magnetizations 401a and 402a to be antiparallel to each other. Then, a permanent magnet HM is arranged at a back side position, which is opposite from ABS that is equivalent to a medium opposing surface of the element, and the magnetizations 401a and 402a of the two ferromagnetic layers 401 and 402 are inclined at approximately 45 degrees relative to a track width direction by the bias magnetic field generated from the permanent magnet HM, respectively, and an initial state where they are substantially orthogonalized is produced (see FIG. 23). When the element in this initial magnetization state detects a signal magnetic field from a medium, the magnetization directions of the two ferromagnetic layers 401 and 402 are changed as if the operation of scissors cutting paper, and as a result, a resistance value for the element is changed. Furthermore, such element structure is referred to as a dual free layer (DFL) element structure in the present specification as a matter of convenience.

When this DFL element structure is applied to a TMR element or a CPP-GMR element, it becomes possible to further narrow a "read gap", which is a space of the upper and lower shield layers 403 and 404, compared to a general spin-valve type CPP-GMR element. Specifically, an antiferromagnetic layer, which is required for the general spin-valve type CPP-GMR element, becomes not required, and in addition, the ferromagnetic layer in "synthetic pinned structure" also becomes not required.

In order to form the DFL element structure, the two ferromagnetic layers 401 and 402 need to be exchange-coupled so as to have their magnetizations 401a and 402a to be antiparallel to each other. Such structure is easily formable by inserting metal, such as Au, Ag, Cu, Ir, Rh, Ru or Cr, between the two ferromagnetic layers 401 and 402, and by generating exchange-coupling between the two ferromagnetic layers 401 and 402.

However, in the TMR element, an insulating film, such as an aluminum oxide (AlOx) film or a magnesium oxide (MgO) film, has to be intervened between the two ferromagnetic layers in order to obtain a tunnel effect, and inconvenience that it becomes difficult to generate a strong exchange coupling between the two ferromagnetic layers can occur. As a result, it becomes extremely difficult to bring the magnetizations of the two ferromagnetic layers to an antiparallel state.

Further, in association with the recent ultrahigh recording density, it becomes essential to improve the resolution in a cross-track direction in the CPP-GMR element, but in the CPP-GMR element using the DFL element structure in the prior art, there is a problem where the resolution capacity in the cross-track direction is still insufficient.

In addition, in the head structure using the DFL element structure, in order to realize sufficient bias magnetic field intensity for forming the initial state from the permanent magnet HM, such as CoPt, arranged at the back side position opposite from the ABS, the thickness of the permanent magnet HM has to be increased. Increase in the thickness of the permanent magnet HM means that an advantage that the DFL element structure is a structure that can narrow a read gap cannot sufficiently be fulfilled. If the thickness of the permanent magnet HM is attempted to be increased and the read cap is attempted to be narrowed, the space between the permanent magnet HM and the upper and lower shield layers 403 and 404 becomes smaller, respectively, and a bias magnetic field to be generated from the permanent magnet HM passes through the upper and lower shield layers 403 and 404, and the application of the bias magnetic field to the element becomes insufficient and a problem that a resistive change of the element can no longer be detected can occur.

In addition, in the head structure using the DFL element structure, the permanent magnet HM is arranged at the back side position, which is opposite from ABS, and the initial state is attempted to be formed in the two ferromagnetic layers 401 and 402 by applying the bias magnetic field from the permanent magnet HM to the two ferromagnetic layers 401 and 402. However, the bias magnetic field from the permanent magnet HM may leak from the element, and due to the leaked magnetic field, a problem(s) that a signal is falsely written into a medium or a signal recorded in a medium demagnetizes or degausses may also occur.

SUMMARY OF THE INVENTION

The objective of the present invention is to provide a magnetoresistive effect element (MR element) that can improve the linear recording density by adopting a structure, which can narrow a read gap (space between the upper and lower shield layers), in order to respond to the recent demand for ultrahigh recording density, and, that can suppress false writing of a signal into a medium, demagnetization or degauss of a recorded signal in a medium, and that can improve a sensitivity (reproducing characteristic) to an external magnetic field to be detected; a thin film magnetic head including the MR element; a head gimbal assembly (HGA) including the thin film magnetic head; and a magnetic disk apparatus.

In order to the above objection, this invention provides a magnetoresistive effect element (MR element), comprising a magnetoresistive effect part (MR part), an upper shield layer and a lower shield layer that are lamination-formed so as to interpose the MR part from top and bottom, having a current-perpendicular-to-plane (CPP) structure in which a sense current is applied in the lamination direction. Wherein, the MR element further has side shield layers formed intervening an insulating layer on the lower shield layer so as to interpose the MR part from both sides in a track width direction when viewed from a medium opposing surface of the MR element; the MR part comprises a nonmagnetic intermediate layer, a first ferromagnetic layer and a second ferromagnetic layer to be lamination-formed so as to interpose the nonmagnetic intermediate layer from top and bottom; each of the upper shield layer and the lower shield layer has an inclined magnetization structure of which its magnetization is inclined relative to the track width direction; the side shield layers are magnetically coupled with the upper shield layer, respectively; the second ferromagnetic layer is indirectly magnetically coupled with the lower shield layer via an exchange-coupling functional gap layer positioned between the second ferromagnetic layer and the lower shield layer; the side shield layer is configured to be able to apply a bias magnetic field to at least the first ferromagnetic layer; and a magnetization of the first ferromagnetic layer and a magnetization of the second ferromagnetic layer are configured to be substantially orthogonalized (first invention).

In the MR element relating to the invention (first invention) described above, at least the magnetization of a first ferromagnetic layer is inclined relative to a track width direction due to an application of a bias magnetic field from a side shield layer, and, the magnetization of a second ferromagnetic layer is inclined relative to the track width direction due to indirect magnetic coupling with the lower shield layer. As a result, the magnetization of the first ferromagnetic layer and the magnetization of the second ferromagnetic layer are substantially orthogonalized, and the external magnetic field can be detected.

Further, in the invention (first invention), because the side shield layers are established at both sides of the MR part fulfilling a function as a sensor in the track width direction, the resolution capacity in the track width direction can be improved, and the sensitivity (reproducing characteristic) relative to the external magnetic field to be detected in response to the ultrahigh recording density can be improved.

In addition, although the second ferromagnetic layer is indirectly magnetic-coupled with the lower shield layer, the first ferromagnetic layer will not be magnetic-coupled with the upper shield layer. Although it is also possible to incline the magnetization of the first ferromagnetic layer relative to the track width direction by indirectly magnetically coupling the first ferromagnetic layer with the upper shield layer, because the magnetic coupling between the upper shield layer and the first ferromagnetic layer becomes weak, an angle of inclination of the magnetization of the first ferromagnetic layer relative to the track width direction may become smaller because of effects of a magnetostatic coupling between the first ferromagnetic layer and the second ferromagnetic layer and a demagnetizing field. These may cause a decrease in the reproducing output and an increase in asymmetry of reproducing waveform, and may reduce the sensitivity to the external magnetic field to be detected.

However, according to the invention (first invention) described above, since at least the magnetization of the first ferromagnetic layer is inclined due to the application of the bias magnetic field from the side shield layers, the angle of inclination of the magnetization of the first ferromagnetic layer relative to the track width direction can be maintained at a predetermined angle; therefore, the sensitivity to the external magnetic field to be detected can be improved.

In the above invention (first invention), the magnetization of the side shield layers is preferably inclined from at 15 degrees to 75 degrees relative to the track width direction (second invention). In such an invention (second invention), the magnetization of the lower shield layer is inclined from at 15 degrees to 75 degrees relative to the track width direction (third invention).

In the above invention (first invention), it is preferred that the side shield layer has a lamination structure with N layers (N is integer, 2 or greater) that is from a first side shield layer positioned at the upper shield layer side to an $N^{th}$ side shield layer positioned at the lower shield layer side, and an exchange-coupling layer that is positioned between an $(M-1)^{th}$ side shield layer (M is integer between 2 and N) and an $M^{th}$ side shield layer; the $(M-1)^{th}$ side shield layer and the $M^{th}$ side shield layer are indirectly magnetically coupled with each other via the exchange-coupling functional layer; the first side shield layer is magnetically coupled with the upper shield layer; and a thickness from the second side shield layer to the $N^{th}$ side shield layer is within 1 nm to 10 nm (fourth invention).

In the above invention (first invention), it is preferred that at least either of the upper shield layer or the lower shield layer comprises a nonmagnetic layer, a first shield layer and a second shield layer that are lamination-formed so as to interpose the nonmagnetic layer; and the first shield layer and the second shield layer are exchange-coupled via the nonmagnetic layer so that magnetizations of the first shield layer and the second shield layer are inclined relative to the track width direction, respectively, and are antiparallel to each other (fifth invention).

In the above invention (first invention), it is preferred that the exchange-coupling functional gap layer sequentially comprises, from the lower shield layer side, an exchange-coupling transmitting layer, a gap adjustment layer and an exchange-coupling adjustment layer (sixth invention).

In the above invention (first invention), the exchange-coupling functional gap layer sequentially comprises, from the lower shield layer side, a first exchange-coupling transmitting layer, a first gap adjustment layer, a second exchange-coupling transmitting layer, a second gap adjustment layer and an exchange-coupling adjustment layer (seventh invention).

In the above invention (first invention), the MR element is interposed by an upper antiferromagnetic body layer adjacent to the upper shield layer and a lower antiferromagnetic body layer adjacent to the lower shield layer from top and bottom, blocking temperature of an antiferromagnetic material constituting the lower antiferromagnetic body layer is higher than that of an antiferromagnetic material constituting the upper antiferromagnetic body layer (eight invention).

In the above invention (first invention), it is preferred that a bias magnetic field application part that applies a bias magnetic field to the first ferromagnetic layer and the second ferromagnetic layer is not established at the back side of the MR part when viewed from the medium opposing surface side of the MR element (ninth invention).

The present invention provides a medium opposing surface that is opposed to a recording medium; and the MR element according to claim 1 arranged in the vicinity of the medium opposing surface in order to detect a signal magnetic field from the recording medium (tenth invention).

Further, the present invention provides a head gimbal assembly (HGA), comprising: a slider that includes the thin film magnetic head with respect to the above invention (tenth invention), and is arranged so as to be opposed to a recording medium, and a suspension that elastically supports the slider.

Furthermore, the present invention provides a slider that includes the thin film magnetic head with respect to the above invention (tenth invention), and is arranged so as to be opposed to a recording medium, and a positioning device that supports the slider, and, that positions the slider relative to the recording medium (twelfth invention).

According to the present invention, in order to respond to the recent demand for the ultrahigh recording density, an MR element that can improve the linear recording density by adopting the structure that can narrow a read gap (space between the upper and lower shield layers), and that can prevent false writing of a signal into a medium and demagnetization or degauss of a recorded signal in a medium, and, that can improve a sensitivity (reproducing characteristic) to an external magnetic field to be detected; a thin film magnetic head including the MR element; an HGA including the thin film magnetic head; and a magnetic disk apparatus can be provided.

DESCRIPTION OF THE PREFERRED EMBODIMENTS

Before explaining an embodiment of the present invention, terms used in the present specification are defined. In the present specification, a dimension in the X-axis direction, a dimension in the Y-axis direction and a dimension in the Z-axis direction shown in each drawing are expressed as "width", "length" and "thickness", respectively. Further, a side that is closer to an air bearing surface (a surface of a thin film magnetic head opposing to a recording medium) in the Y-axis direction, and its opposite side (a back side) are expressed as "forward" and "backward", respectively. In addition, in a multilayer structure of an element or an element structure, a substrate direction is referred to as "downward" or "lower side" viewing from a reference layer or an element, and its opposite direction is referred to as "upward" or "upper side".

[Magnetoresistive Effective Element (MR Element)]

An MR element relating to the embodiment of the present invention is explained with reference to the drawings.

Figure 1:
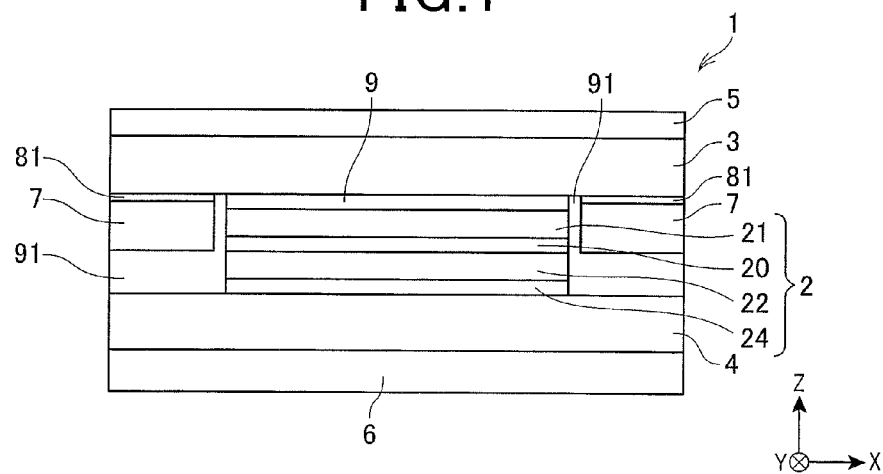
FIG. 1 is a plan view showing an MR element with a CPP structure (CPP-MR element) relating to one embodiment of the present invention in a pattern manner viewing from an air bearing surface (ABS) side.
Figure 2:
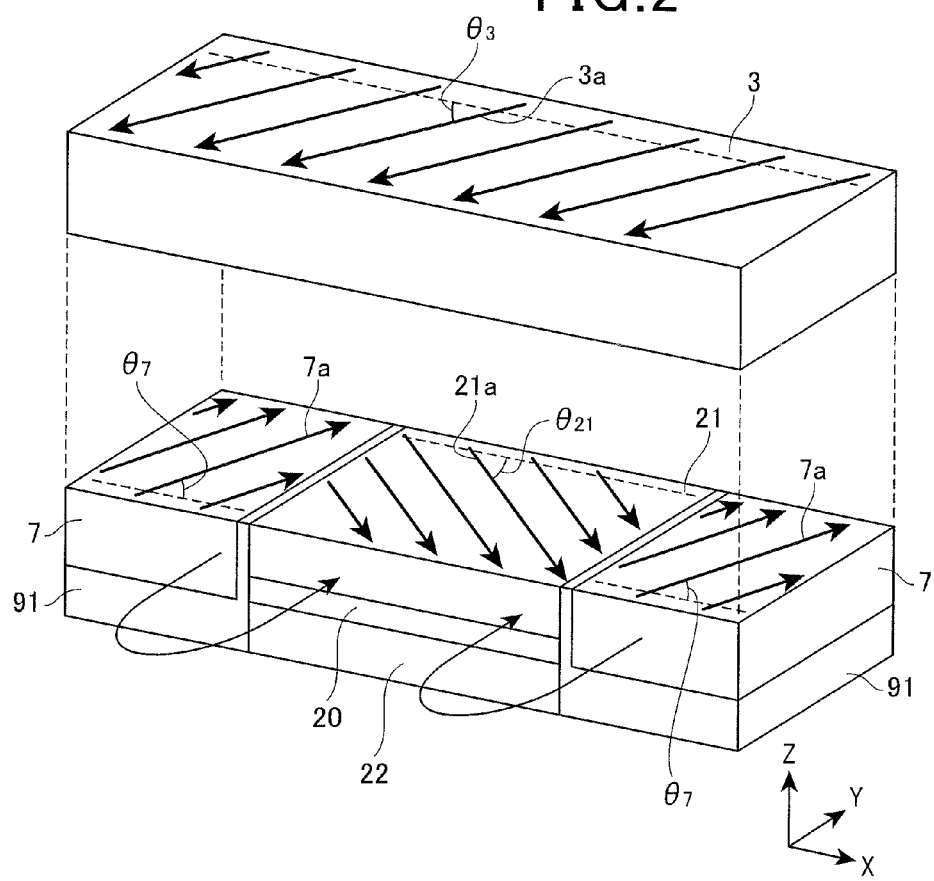
FIG. 2 is an exploded perspective view showing a magnetization state of an upper shield layer, side shield layers and a first ferromagnetic layer in the MR element relating to one embodiment of the present invention in a pattern manner.
Figure 3:
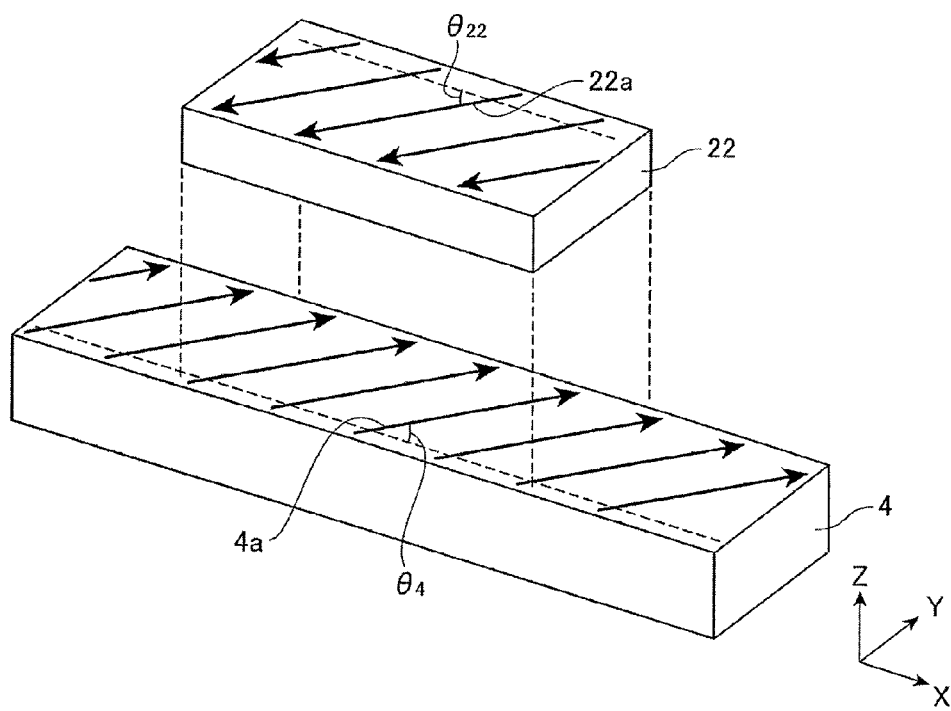
FIG. 3 is an exploded perspective view showing a magnetization state of a lower shield layer and a second ferromagnetic layer in the MR element relating to one embodiment of the present invention in a pattern manner.
Figure 4:
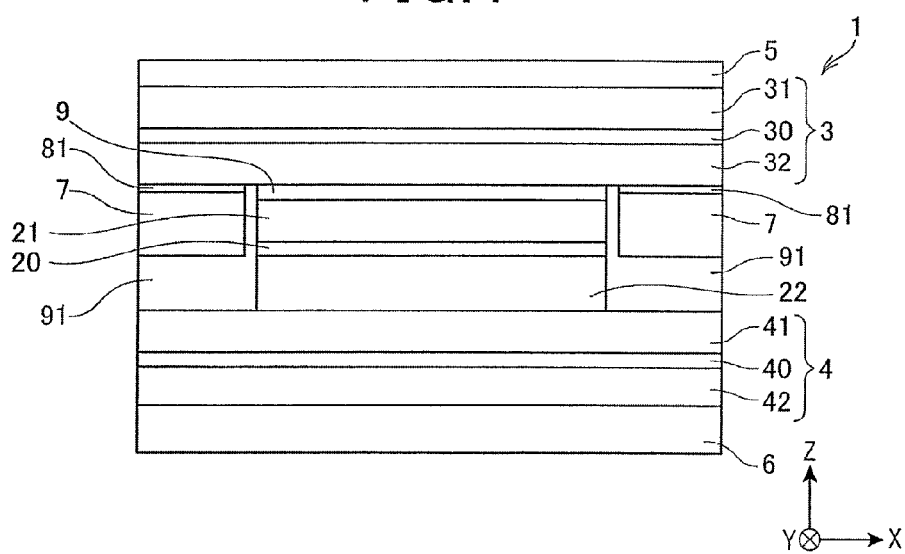
FIG. 4 is a plan view showing another configuration example of the MR element relating to one embodiment of the present invention in a pattern manner, viewing from the ABS side.
Figure 5A:
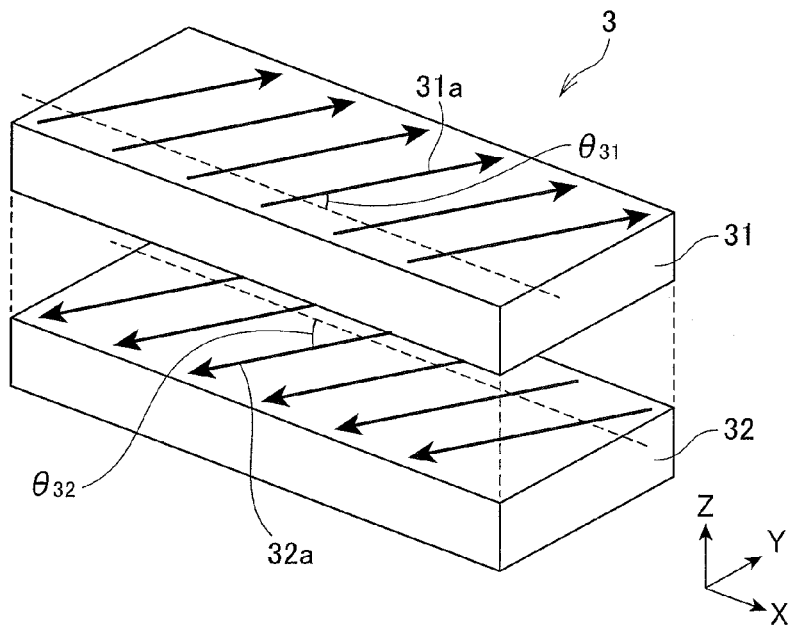
FIGS. 5A and 5B are an exploded perspective view showing a magnetization state of the upper shield layer and the lower shield layer in the MR element shown in FIG. 4 in a pattern manner.
Figure 5B:
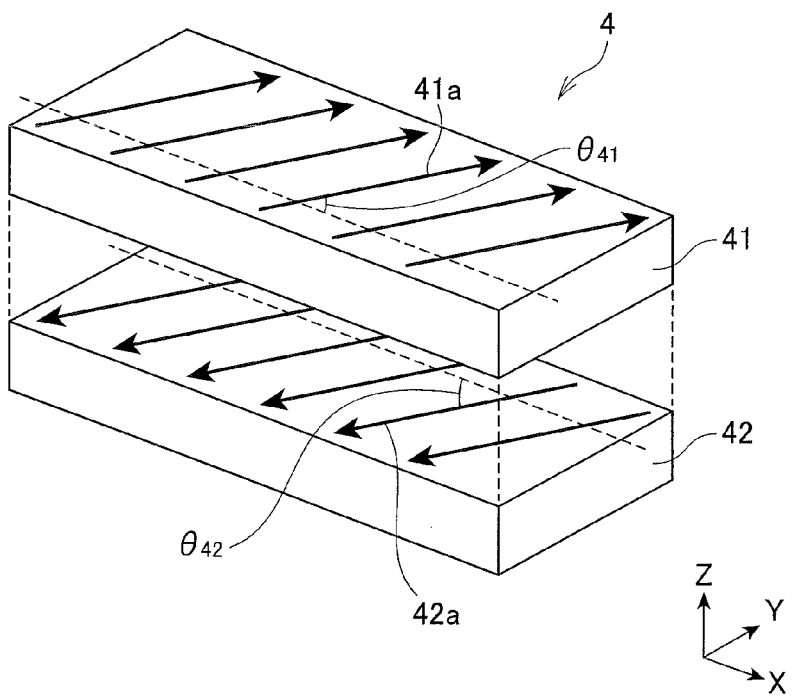

FIG. 1 is a plan view showing the MR element with a CPP structure (CPP-MR element) out of reproducing heads in the present embodiment in a pattern manner, viewing from an air bearing surface (ABS) side; FIG. 2 is an exploded perspective view showing a magnetization state of an upper shield layer, side shield layers and a first ferromagnetic layer in the MR element relating to the present embodiment in a pattern manner; FIG. 3 is an exploded perspective view showing a magnetization state of a lower shield layer and a second ferromagnetic layer in the MR element relating to the present embodiment in a pattern manner; FIG. 4 is a plan view showing another configuration example of the MR element relating to the present embodiment in a pattern manner, viewing from the ABS side; and FIGS. 5A and 5B are exploded perspective views showing a magnetization state of the upper shield layer and the lower shield layer in the MR element shown in FIG. 4 in a pattern manner.

As shown in FIG. 1, an MR element 1 has a magnetoresistive effect part (MR part) 2, and an upper shield layer 3 and a lower shield layer 4 lamination-formed so as to interpose this MR part 2 from top and bottom, and has a Current-Perpendicular-to-Plane (CPP) structure where a sense current is applied in this lamination direction.

MR Part

The MR part 2 has a nonmagnetic intermediate layer 20, and a first ferromagnetic layer 21 and a second ferromagnetic layer 22 lamination-formed so as to interpose the nonmagnetic intermediate layer 20 from top and bottom. A multilayer body with these three layers (the first ferromagnetic layer 21, the nonmagnetic intermediate layer 20 and the second ferromagnetic layer 22) is a sensor region, and the total thickness of this multilayer body is approximately 10 to 30 nm. Further, the MR part 2 has an exchange-coupling functional gap layer 24 intervening between the second ferromagnetic layer 22 and the lower shield layer 4. In addition, a cap layer 9 made of Au, Cu, Zr, Ta, Ru, Ti or the like intervenes between the first ferromagnetic layer 21 and the upper shield layer 3. Furthermore, the thickness of the cap layer 9 can be set at approximately 0.5 nm to 8 nm.

Furthermore, an insulating layer 91 made of alumina ($Al_2O_3$) or the like for defining the track width for reading is arranged at both sides of the MR part 2 in the track width direction (X direction), respectively.

The first ferromagnetic layer 21 and the second ferromagnetic layer 22 are affected by a magnetic field applied from the outside (external magnetic field), and have a function to change the direction of magnetization as a so-called free layer in response to the external magnetic field, respectively.

As materials for the first ferromagnetic layer 21 and the second ferromagnetic layer 22, NiFe, CoFe, CoFeB, CoFeNi, $Co_2MnSi$, $Co_2MnGe$ and $FeO_X$ (oxide of Fe) and the like can be exemplified. The thickness of the first ferromagnetic layer 21 and the second ferromagnetic layer 22 can be set at approximately 0.5 nm to 8 nm, respectively.

The nonmagnetic intermediate layer 20 is an essential film for expressing a magnetoresistive effect (MR effect) for the MR element 1 relating to the present embodiment. As a constituent material for the nonmagnetic intermediate layer 20, Cu, Au, Ag, Zn, Ga, $TiO_X$, ZnO, InO, SnO, GaN, indium tin oxide (ITO), $Al_2O_3$, MgO and the like can be exemplified. Preferably, the nonmagnetic intermediate layer 20 is formed with a lamination film with two or more layers. For example, the nonmagnetic intermediate layer 20 is preferably formed with a three-layer lamination film with Cu/ZnO/Cu. Further, if the nonmagnetic intermediate layer 20 is formed with a three-layer lamination film with Cu/ZnO/Zn where one Cu is substituted by Zn, it is preferable because its output is improved. Furthermore, the thickness of the nonmagnetic intermediate layer 20 can be set at approximately 0.5 nm to 5 nm.

As described later, in the present embodiment, the magnetization 21a of the first ferromagnetic layer 21 is inclined at a predetermined angle $\theta_{21}$ (approximately 45 degrees) relative to the track width direction (X direction) by applying a bias magnetic field from the side shield layer 7 where its magnetization 7a is inclined at a predetermined angle $\theta_7$ (see FIG. 2). Further, the magnetization 22a of the second ferromagnetic layer 22 inclines magnetization 4a of the lower shield layer 4 at a predetermined angle $\theta_4$ and indirectly magnetically couples the lower shield layer 4 and the second ferromagnetic layer 22 by intervening an exchange-coupling functional gap layer 24, and, is inclined at a predetermined angle $\theta_{22}$ (approximately 45 degrees) relative to the track width direction (X direction) by applying a bias magnetic field to the second ferromagnetic layer 22 from the side shield layer 7 (see FIG. 3). Consequently, the magnetizations 21a and 22a of the first ferromagnetic layer 21 and the second ferromagnetic layer 22 are substantially orthogonalized with each other by inclining at the predetermined angles $\theta_{21}$ and $\theta_{22}$, respectively. Consequently, in the present embodiment, it is unnecessary to exchange-couple the first ferromagnetic layer 21 with the second ferromagnetic layer 22. Therefore, as a material for the nonmagnetic intermediate layer 20 intervened between the first ferromagnetic layer 21 and the second ferromagnetic layer 22, a nonmagnetic body of oxide semiconductor, such as ZnO and the like can be used. As a result, compared to the MR element intervening a metallic intermediately layer (such as Ag, Cu or the like) between the first ferromagnetic layer 21 and the second ferromagnetic layer 22, any effect of spin torque by an electric current flowing in the lamination direction of the element can be suppressed and a magnetoresistive ratio (MR ratio) can be improved. Further, because it is unnecessary to exchange-couple the first ferromagnetic layer 21 with the second ferromagnetic layer 22, the nonmagnetic intermediate layer 20 has greater latitude in its constituent material, and a degree of freedom for design is increased.

Upper Shield Layer and Lower Shield Layer

The upper shield layer 3 and the lower shield layer 4 have a magnetic shield function from an external magnetic field and another function as an electrode on the occasion of applying a sense current. Furthermore, in the present embodiment, the upper shield layer 3 and the lower shield layer 4 do not require the function as an electrode, and separated from the upper shield layer 3 and the lower shield layer 4, another form where a new electrode layer is additionally laminated is also acceptable.

As a constituent material for the upper shield layer 3 and the lower shield layer 4, NiFe (permalloy), CoZrTa, sendust, NiFeCo, CoZrNb and the like can be exemplified. Further, the thickness (Z direction) of the upper shield layer 3 and the lower shield layer 4 can be set at approximately 20 nm to 3 μm.

As shown in FIG. 2, the upper shield layer 3 has an inclined magnetization structure where its magnetization 3a is inclined at a predetermined angle $\theta_3$ relative to the track width direction (X direction). As described later, the magnetization 21a of the first ferromagnetic layer 21 can be inclined at a predetermined angle $\theta_{21}$ relative to the track width direction (X direction) by applying a bias magnetic field to the first ferromagnetic layer 21 from the side shield layer 7 where the magnetization 7a is inclined at the predetermined angle $\theta_7$ relative to the track width direction (X direction). Then, the upper shield layer 3 and the side shield layer 7 have a synthetic anti-ferromagnetic (SAF) structure that is antiferromagnetically exchange-coupled via an exchange-coupling functional layer 81 (see FIG. 1). Consequently, the angle of inclination $\theta_3$ of the magnetization 3a of the upper shield layer 3 can be set so as to enable the magnetization 7a of the side shield layer 7 to incline at the predetermined angle $\theta_3$. The angle of inclination $\theta_3$ of the magnetization 3a of the upper shield layer 3 relative to the track width direction (X direction) can be set at, for example, 15 degrees to 75 degrees, preferably 20 degrees to 70 degrees, and particularly preferably 30 degrees to 60 degrees.

Further, as shown in FIG. 3, the lower shield layer 4 has an inclined magnetization structure that its magnetization 4a is inclined at the predetermined $\theta_4$ relative to the track width direction (X direction). The magnetization 22a of the second ferromagnetic layer 22 that is indirectly magnetically coupled intervening the exchange-coupling functional gap layer 24 can be inclined relative to the track width direction (X direction) by having the inclined magnetization structure in the magnetization 4a of the lower shield layer 4. However, a bias magnetic field from the side shield layer 7 is applied to the first ferromagnetic layer 21, and the second ferromagnetic layer 22, as well. Consequently, taking any effect of the bias magnetic field to be applied to the second ferromagnetic layer 22 from the side shield layer 7 into consideration, as well, the angle of inclination $\theta_4$ of the magnetization 4a of the lower shield layer 4 can be appropriately set so as to incline the magnetization 22a of the second ferromagnetic layer 22 at the predetermined angle $\theta_4$. The angle of inclination $\theta_4$ of the magnetization 4a of the lower shield layer 4 relative to the track width direction (X direction) can be set at, for example, approximately 15 degrees to 75 degrees, preferably approximately 20 degrees to 70 degrees, and particularly preferably approximately 30 degrees to 60 degrees.

A first antiferromagnetic body layer 5 is adjacently formed on the upper shield layer 3, and a second antiferromagnetic body layer 6 is adjacently formed under the lower shield layer 4. Because of this design, the magnetization 3a of the upper shield layer 3 is pinned in a state inclined at the predetermined $\theta_3$ relative to the track width direction (X direction) due to the exchange-coupling between the upper shield layer 3 and the first antiferromagnetic body layer 5. Further, the magnetization 4a of the lower shield layer 4 is pinned in a state inclined at the predetermined $\theta_4$ relative to the track width direction (X direction) due to the exchange-coupling between the lower shield layer 4 and the second antiferromagnetic body layer 6.

As described above, the exchange-coupling functional gap layer 24 intervenes between the lower shield layer 4 and the second ferromagnetic layer 22. With this design, the second ferromagnetic layer 22 is indirectly magnetically coupled with the lower shield layer 4 where the direction of the magnetization 4a is inclined at the predetermined angle $\theta_4$ relative to the track width direction (X direction) via the exchange-coupling functional gap layer 24. Along with this, a bias magnetic field from the side shield layer 7 is applied to the second ferromagnetic layer 22. Therefore, the magnetization 22a of the second ferromagnetic layer 22 can be inclined at the predetermined angle $\theta_{22}$.

In the meantime, in the present embodiment, the cap layer 9 is established between the upper shield layer 3 and the first ferromagnetic layer 21. Consequently, the magnetization 21a of the first ferromagnetic layer 21 is inclined at the predetermined angle $\theta_{21}$ only by applying the bias magnetic field from the side shield layer 7 to the first ferromagnetic layer 21, without magnetically coupling the upper shield layer 3 with the first ferromagnetic layer 21. Consequently, since the magnetization 21a of the first ferromagnetic layer 21 can be inclined at the predetermined angle $\theta_3$ by applying the bias magnetic field from the side shield layer 7 without indirectly magnetically coupling the upper shield layer 3 with the first ferromagnetic layer 21, fluctuation of the angle $\theta_{21}$ of the magnetization 21a of the first ferromagnetic layer 21 due to weakness of the magnetic coupling of the upper shield layer 3 with nd the first ferromagnetic layer 21 and a demagnetizing field can be suppressed, and the function as a sensor of the MR part 2 can be stabilized.

Further, according to the MR element 1 relating to the present embodiment, even though a bias magnetic field application part, such as a hard magnet, for applying the bias magnetic field, is not arranged at the Y-direction depth region of the first ferromagnetic layer 21 and the second ferromagnetic layer 22, their magnetizations 21a and 22a can be substantially orthogonalized. As a result, a so-called "read gap" can be narrowed, and, false writing into a medium from the bias magnetic field application part, such as a hard magnet, due to a leaked magnetic field can be effectively suppressed. Furthermore, the substantial orthogonalization between the magnetization 21a of the first ferromagnetic layer 21 and the magnetization 22a of the second ferromagnetic layer 22 can be set at approximately 90 degrees±15 degrees.

As shown in FIG. 4, the upper shield layer 3 preferably has an upper nonmagnetic layer 30 and, a first shield layer 31 and a second upper shield layer 32 that are lamination-formed so as to interpose the upper nonmagnetic layer 30 from top and bottom.

In this case, the first upper shield layer 31 formed adjacent to the first antiferromagnetic body layer 5 and the second upper shield layer 32 have an inclined magnetization structure where their magnetizations 31a and 32a are inclined at predetermined angles $\theta_{31}$ and $\theta_{32}$ (angles so as to enable the magnetization 7a of the side shield layer 7 to incline at the predetermined angle $\theta_7$) relative to the track width direction (X direction), and they are exchange-coupled via the upper nonmagnetic layer 30 so as to have their magnetizations 31a and 32a to be antiparallel to each other (see FIG. 5A).

Further, as shown in FIG. 4, it is preferable that the lower shield layer 4 similarly has a lower nonmagnetic layer 40, and a first lower shield layer 41 and a second lower shield layer 42 lamination-formed so as to interpose the lower nonmagnetic layer 40 from top and bottom.

In this case, the first lower shield layer 41 and the second lower shield layer 42 formed adjacently to the second antiferromagnetic body layer 6 have an inclined magnetization structure where their magnetizations 41a and 42a are inclined at predetermined angles $\theta_{41}$ and $\theta_{42}$ (angles so as to enable to incline the magnetization 22a of the second ferromagnetic layer 22 at the predetermined angle $\theta_{22}$) relative to the track width direction (X direction), and they are exchange-coupled via the lower nonmagnetic layer 40 so as to have their magnetizations 41a and 42a to be antiparallel to each other (see FIG. 5B).

Since the magnetizations 31a and 32a of the first upper shield layer 31 and the second upper shield layer 32 and the magnetizations 41a and 42a of the first lower shield layer 41 and the second lower shield layer 42 become in an antiparallel state to each other, respectively, any leaking magnetic field from the upper shield layer 3 or the lower shield layer 4 can be further suppressed. As a result, false writing into a medium or demagnetization/degauss due to any leaking magnetic field from the upper shield layer 3 or the lower shield layer 4 can be further effectively prevented.

Side Shield Layer

As shown in FIG. 1, the side shield layer 7 is positioned at X-direction both sides of the MR part 2 and above the lower shield layer 4 by intervening an insulating layer 91, such as $Al_2O_3$ and the like, when viewed from the ABS side.

An exchange-coupling functional layer 81 made of Ru, Cu or the like is intervened between the side shield layer 7 and the upper shield layer 3. Consequently, the side shield layer 7 is indirectly antiferromagnetically exchange-coupled with the upper shield layer 3 where the direction of magnetization 3a is inclined at the predetermined angle $\theta_3$ relative to the track width direction (X direction) via the exchange-coupling functional layer 81. Therefore, the magnetization 7a of the side shield layer 7 can be inclined at the predetermined angle $\theta_7$.

Furthermore, in the present embodiment, the exchange-coupling functional layer 81 is positioned between the side shield layer 7 and the upper shield layer 3, and the side shield layer 7 and the upper shield layer 3 are indirectly magnetically coupled, but the side shield layer 7 and the upper shield layer 3 can be directly magnetically coupled without having the exchange-coupling functional layer 81 present. The magnetization 7a of the side shield layer 7 can be further stabilized by directly magnetically coupling the side shield layer 7 with the upper shield layer 3.

As a constituent material for the side shield layer 7, for example, soft magnetic materials and the like, such as NiFeMo, NiFe, CoFe, Co, Fe, CoZrNb, NiFeCo, CoZrTa or sendust and the like, can be exemplified. The thickness of the side shield layer 7 is appropriately set within the range where a bias magnetic field is applicable to at least the first ferromagnetic layer 21, and it can be set, for example, approximately at 1 nm to 30 nm.

The angle $\theta_7$ of the magnetization 7a of the side shield layer 7 relative to the track width direction (X direction) is preferably 15 degrees to 75 degrees, and further preferably 20 degrees to 70 degrees, and particularly preferably 30 degrees to 60 degrees. Because the angle $\theta_7$ of the magnetization 7a of the side shield layer 7 is within the range above, the bias magnetic field becomes applicable to the first ferromagnetic layer 21 and the second ferromagnetic layer 22 while the side shield layer 7 maintains its original shield function, and due to the application of the bias magnetic field, the angles $\theta_{21}$ and $\theta_{22}$ of the magnetizations 21a and 22a of the first ferromagnetic layer 21 and the second ferromagnetic layer 22 can be set at approximately 45 degrees relative to the track width direction (X direction). Consequently, the MR element 1 that has high resolution capacity in the cross-track direction, and that can respond to [the demand for] ultrahigh recording density can be provided by arranging the side shield layers 7 at both sides of the MR part 2 in the track direction (X direction). Further, the fluctuation of the angle $\theta_{21}$ of the magnetization 21a of the first ferromagnetic layer 21 attributable to weakness of the magnetic coupling between the upper shield layer 3 and the first ferromagnetic layer 21 and the demagnetizing field can be suppressed, by applying the bias magnetic field to at least the first ferromagnetic layer 21 from the side shield layer 7 and by inclining the magnetization 21a of the first ferromagnetic layer 21 at the predetermined angle $\theta_{21}$ without indirectly magnetically coupling the upper shield layer 3 with the first ferromagnetic layer 21, and the function of the MR part 2 as a sensor can be stabilized.

Figure 6A:
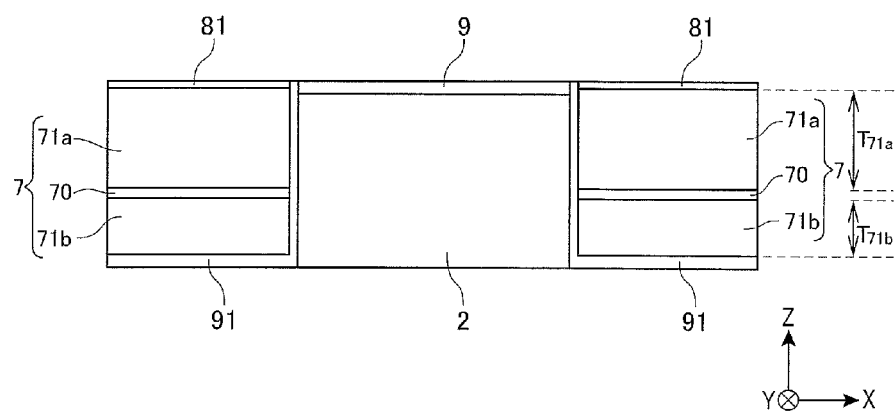
FIG. 6A and FIG. 6B are plan views showing other configuration examples of the side shield layers in one embodiment of the present invention in a pattern manner, viewing from the ABS side.

In the present embodiment, the side shield layer 7, as shown in FIG. 6A, has a lamination structure with two layers: a first side shield layer 71a positioned at the upper shield layer 3 side and a second side shield layer 71b positioned at the lower shield layer 4 side, and it is preferable to establish the exchange-coupling functional layer 70 [made of], such as Ru, Cu or the like, between them. In the MR element 1 having the side shield layer 7 (see FIG. 1) formed with one layer above, a bias magnetic field from the side shield layer 7 is also applied to the second ferromagnetic layer 22. Consequently, in order to incline the magnetization 22a of the second ferromagnetic layer 22 at the predetermined angle $\theta_{22}$, it is necessary to adjust the angle $\theta_4$ of the magnetization 4a of the lower shield layer 4 that is indirectly magnetically coupled with the second ferromagnetic layer 22, intensity of the bias magnetic field applied from the side shield layer 7. However, according to the side shield layer 7 having the configuration shown in FIG. 6A, even though the bias magnetic field from the side shield layer 7 is sufficiently applied to the first ferromagnetic layer 21, it will hardly be applied to the second ferromagnetic layer 22. Consequently, the angle $\theta_{22}$ of the magnetization 22a of the second ferromagnetic layer 22 becomes controllable by the indirect magnetic coupling with the lower shield layer 4. Therefore, the effect that the control of the angle $\theta_{22}$ of the magnetization 22a of the second ferromagnetic layer 22 becomes easy is produced.

In this case, when the film thickness $T_{71a}$ of the first side shield layer 71a is set at 1 nm to 30 nm, the film thickness $T_{71b}$ of the second side shield layer 71b is preferably 1 nm to 10 nm, and further preferably 2 nm to 7 nm. If the film thicknesses $T_{71a}$ and $T_{71b}$ of the first side shield layer 71a and the second side shield layer 71b are within the range above, a sufficient bias magnetic field is applied to the first ferromagnetic layer 21 from the side shield layer 7, but hardly applied to the second ferromagnetic layer 22; thus, the angle of inclination $\theta_{22}$ of the magnetization 22a of the second ferromagnetic layer 22 can be stably controlled due to the indirect magnetic coupling with the lower shield layer 4.

Figure 6B:
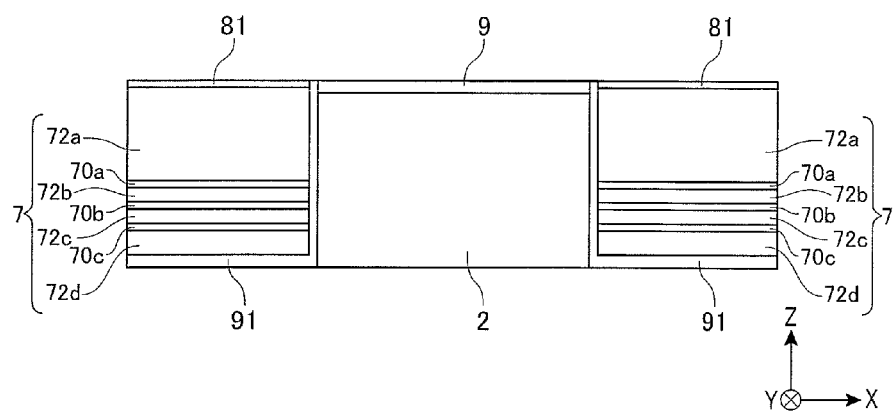

Furthermore, the side shield layer 7 may have a lamination structure with three layers or more. For example, as shown in FIG. 6B, the side shield layer 7 has a lamination structure including a first side shield layer 72a, a second side shield layer 72b, a third side shield layer 72c and a fourth side shield layer 72d in respective order from the upper side layer 3 side to the lower shield layer 4 side, and may be configured by establishing exchange-coupling functional layers 70a to 70c [made of] Ru, Cu or the like between side shields 72a and 72d.

Exchange-Coupling Functional Gap Layer

Figure 7:
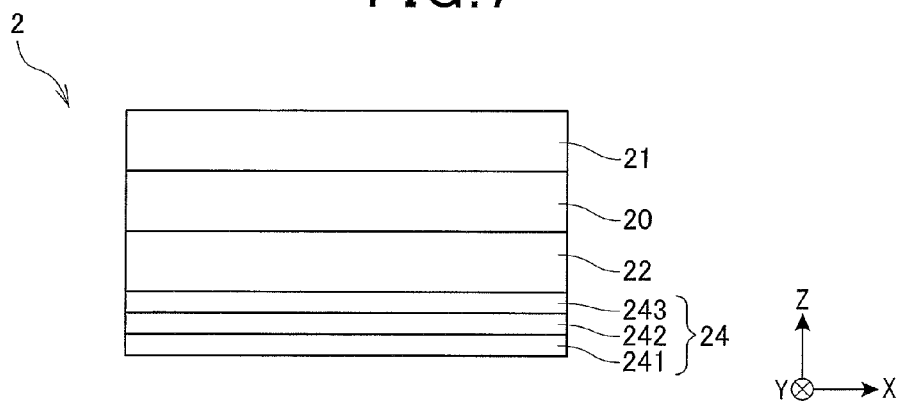
FIG. 7 is a plan view showing an MR element part in one embodiment of the present invention in a pattern manner, viewing from the ABS side.

As shown in FIG. 7, the exchange-coupling functional gap layer 24 includes an exchange-coupling transmitting layer 241, a gap adjustment layer 242 and an exchange-coupling adjustment layer 243 viewing upward from the lower shield layer 4. The gap adjustment layer 242 is a so-called ferromagnetic layer made of a ferromagnetic body.

The exchange-coupling transmitting layer 241 is made of at least one material selected from a group constituting Ru, Rh, Ir, Cr, Cu, Ag, Au, Pt and Pd. The intensity of magnetic coupling between the magnetization 4a of the lower shield layer 4 and the magnetization of the gap adjustment layer 242 can be adjusted by setting the constituent material and the thickness of the exchange-coupling transmitting layer 241. Further, the directionality of the magnetization of the gap adjustment layer 242 that is magnetically coupled with the magnetization 4a of the lower shield layer 4 can be adjusted by setting the constituent material and the thickness of the exchange-coupling transmitting layer 241. In other words, whether the coupling is an antiferromagnetic coupling where magnetizations are orientated toward the opposite directions (antiparallel) from each other or a ferromagnetic coupling where magnetizations are orientated toward the same direction (parallel) with each other can be adjusted according to the selection of the constituent material and the thickness of the exchange-coupling transmitting layer 241.

The exchange-coupling adjustment layer 243 is made of at least one material selected from a group constituting Ru, Rh, Ir, Cr, Cu, Ag, Au, Pt and Pd. The intensity of magnetic coupling between the magnetization of the gap adjustment layer 242 and the magnetization 22a of the second ferromagnetic layer 22 can be adjusted by setting the constituent material and the thickness of the exchange-coupling adjustment layer 243. Further, the directionality of the magnetization 22a of the second ferromagnetic layer 22 that is magnetically coupled with the magnetization of the gap adjustment layer 242 can be adjusted by setting the constituent material and the thickness of the exchange-coupling adjustment layer 243. In other words, whether the coupling is an antiferromagnetic coupling where magnetizations are orientated toward the opposite directions (antiparallel) from each other or a ferromagnetic coupling where magnetizations are orientated toward the same direction (parallel) with each other can be adjusted according to the selection of the constituent material and the thickness of the exchange-coupling adjustment layer 243.

In the present embodiment, it is necessary for the second ferromagnetic layer 22 to function as a so-called free layer that responds to an external magnetic field with high sensitivity, as similar to the first ferromagnetic layer 21. Consequently, the intensity of the magnetic coupling between the magnetization 4a of the lower shield layer 4 and the magnetization of the gap adjustment layer 242 becomes greater; in the meantime, the constituent materials and the thickness of the exchange-coupling transmitting layer 241 and the exchange-coupling adjustment layer 243 can be set so as to comparatively reduce the magnetic coupling between the magnetization of the gap adjustment layer 242 and the magnetization 22a of the second ferromagnetic layer 22.

The thickness of the exchange-coupling functional gap layer 24 can be set at approximately 1.5 nm to 6.0 nm.

Furthermore, a predetermined space (gap) according to the recording density becomes required between the sensor region (the first ferromagnetic layer 21, the nonmagnetic intermediate layer 20 and the second ferromagnetic layer 22), and, the upper shield layer 3 or the lower shield layer 4, respectively. This is for certainly retrieving the external magnetic field as a signal to the sensor region. If the space (gap) is too great more than necessary, in addition to the signal magnetic field to be retrieved, other adjacent signal magnetic field(s) is also likely to be retrieved into the sensor region. Further, if the space (gap) does not reach the necessary distance and is too small, the signal magnetic field to be retrieved into the sensor region is absorbed to the upper shield layer 3 and the lower shield layer 4 surrounding the sensor region, and it is likely not to be retrieved into the sensor region.

In the MR element 1 relating to the present embodiment, the predetermined space (gap) can be secured by having the cap layer 9 and the exchange-coupling functional gap layer 24.

Figure 8:
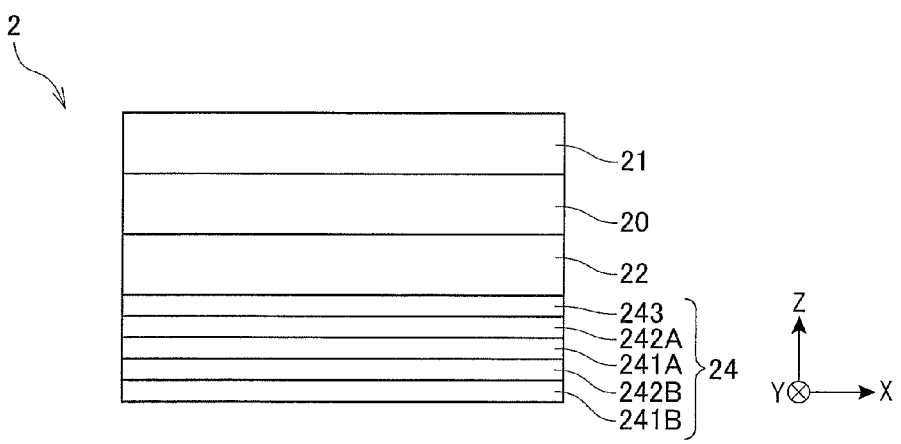
FIG. 8 is a plan view showing another configuration example of the MR element part in one embodiment of the present invention in a pattern manner, viewing from the ABS side.

In the MR part 2 in the present embodiment, the exchange-coupling gap layer 24 may have the configuration shown in FIG. 8.

As shown in FIG. 8, the exchange-coupling gap layer 24 can be configured by sequentially including a second exchange-coupling transmitting layer 241B, a second gap adjustment layer 242B, a first exchange-coupling transmitting layer 241A, a first gap adjustment layer 242A and an exchange-coupling adjustment layer 243, viewing upward from the lower shield layer 4 side. The first and second exchange-coupling transmitting layers 241A and 241B, the first and second gap adjustment layers 242A and 242B and the exchange-coupling adjustment layer 243 all have the similar configuration to the exchange-coupling transmitting layer 241, the gap adjustment layer 242 and the exchange-coupling adjustment layer 243 shown in FIG. 7.

In the exchange-coupling functional gap layer 24 shown in FIG. 8, it becomes possible to zero out a response to the external magnetic field by matching magnetization quantities Mst of two ferromagnetic layers with the first adjustment layer 242A and the second gap adjustment layer 242B, and, by strongly and antiferromagnetically coupling them with each other. Consequently, the MR part 2 in a particularly-preferable mode can be obtained by having the exchange-coupling functional gap layer 24 with such configuration. Further, even if the coupling intensity of the first and second exchange-coupling transmitting layers 241A and 241B is comparatively weak, it becomes possible to certainly have a function as a gap layer.

Adjustment of Intensity of Magnetic Coupling (Intensity of Exchange-Coupling Magnetic Layer)

The adjustment of the intensity of the magnetic coupling (intensity of exchange-coupling magnetic field) is explained with reference to FIG. 9 and FIG. 10.

Figure 9:
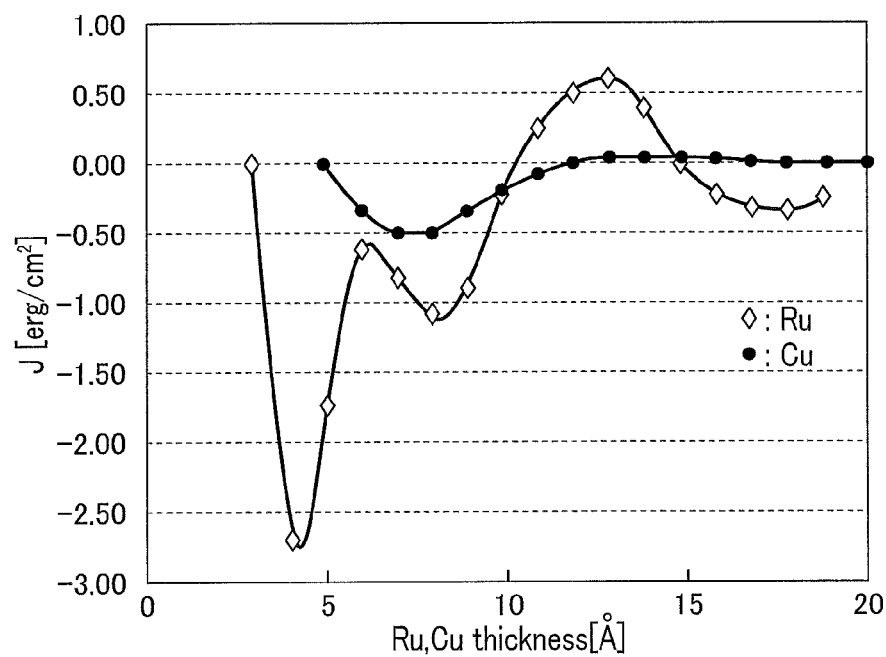
FIG. 9 is a graph showing a relationship between thickness t (Å (angstrom)) of Ru or Cu and intensity of an exchange-coupling magnetic field J ($erg/cm^2$) when Ru or Cu is used as a constituent material for an exchange-coupling transmitting layer and an exchange-coupling adjustment layer in an exchange-coupling functional gap layer in one embodiment of the present invention.

FIG. 9 is a graph showing a relationship between the thickness t (Å (angstrom)) and the intensity J (erg/cm$^2$) of the exchange-coupling magnetic field when Ru or Cu is used as a constituent material for the exchange-coupling transmitting layer 241 and the exchange-coupling adjustment layer 243 in the exchange-coupling functional gap layer 24 shown in FIG. 7). Furthermore, in this graph, as a magnetic material that interposes Ru or Cu and is exchange-coupled, $Co_{90}Fe_{10}$ alloy is used. FIG. 10 is a graph showing a relationship between Cu thickness t (Å (angstrom)) and the intensity J (erg/cm$^2$) of the exchange-coupling magnetic field, and basically, it is substantially the same as the graph regarding Cu shown in FIG. 9, but in particular, it is displayed so as to facilitate the understanding of the fluctuation in the vertical axis by expanding a scale span of the intensity J (erg/cm$^2$) of the exchange-coupling magnetic field expressed in the vertical axis.

Figure 10:
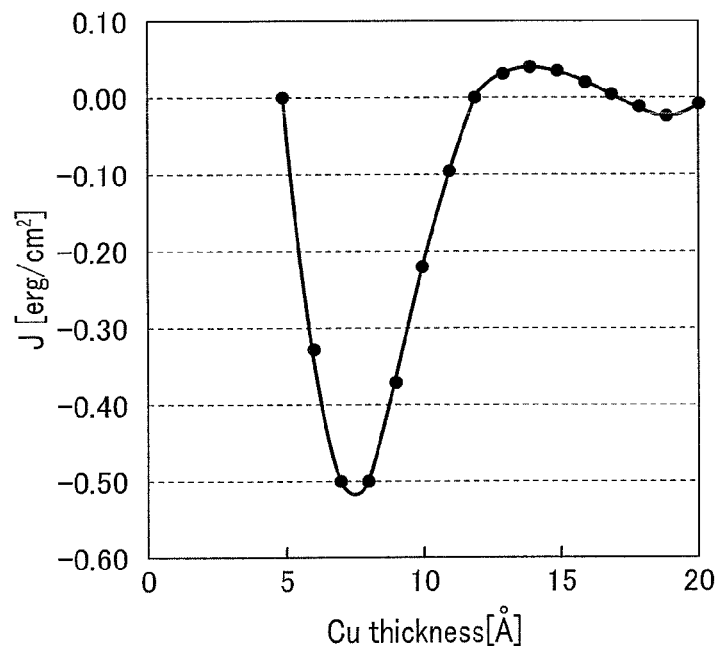
FIG. 10 is a graph showing a relationship between thickness t (Å (angstrom)) of Cu and intensity of an exchange-coupling magnetic field J ($erg/cm^2$) out of the graph shown in FIG. 9.

In the graphs shown in FIG. 9 and FIG. 10, when a value for the intensity J (erg/cm$^2$) of the exchange-coupling magnetic field is plus (+), a so-called ferromagnetic coupling (magnetic coupling where magnetizations are orientated toward the same direction with each other) is generated. In the meantime, when a value for the intensity J (erg/cm$^2$) of the exchange-coupling magnetic field becomes minus (−), a so-called antiferromagnetic coupling (magnetic coupling where magnetizations are orientated toward opposite directions from each other) is generated. Furthermore, an absolute value |J| for the intensity J (erg/cm$^2$) of the exchange-coupling magnetic field indicates an absolute quantity of the coupling intensity itself.

The exchange-coupling transmitting layer 241 is preferably designed such that the absolute value |J| for the intensity J (erg/cm$^2$) of the exchange-coupling magnetic field exceeds 0.2 (erg/cm$^2$) (|J|>0.2 (erg/cm$^2$)). If the absolute value |J| for the intensity J (erg/cm$^2$) of the exchange-coupling magnetic field is 0.2 (erg/cm$^2$) or less, the magnetization of the gap adjustment layer 242 is affected by the magnetic field from a medium and fluctuates, and it is likely to have a function as a shield.

From such viewpoint, in the present embodiment, as it is obvious from the graphs shown in FIG. 9 and FIG. 10, when Cu is used as a constituent material for the exchange-coupling transmitting layer 241, the thickness of the exchange-coupling transmitting layer 241 is preferably 6 Å to 10 Å, and it is preferably set within the range of 4 Å to 9 Å and 16 Å to 20 Å when Ru is used.

In the meantime, it is preferable to design the exchange-coupling adjustment layer 243 such that an absolute value |J| for the intensity J (erg/cm$^2$) of the exchange-coupling magnetic field is more than 0.02 (erg/cm$^2$) and less than 0.6 (erg/cm$^2$) (0.02 erg/cm$^2$<|J|<0.6 erg/cm$^2$). If the absolute value |J| for the intensity J (erg/cm$^2$) of the exchange-coupling magnetic field becomes 0.02 (erg/cm$^2$) or less, the magnetization state of the second ferromagnetic layer 22 functioning as a so-called free layer becomes a multi magnetic domain and Barkhausen noise is likely to occur. In the meantime, the absolute value |J| for the intensity J (erg/cm$^2$) of the exchange-coupling magnetic field becomes 0.6 (erg/cm$^2$) or greater, it becomes difficult for the magnetization of the second ferromagnetic layer 22 functioning as a so-called free layer to freely respond to the signal magnetic field from a medium, and it is likely to lead to low sensitivity.

From such viewpoints, in the present embodiment, as it is clear from the graphs shown in FIG. 9 and FIG. 10, when Cu is used as a constituent material for the exchange-coupling adjustment layer 243, the thickness of the exchange-coupling adjustment layer 243 is preferably set within the range of 13 Å to 16 Å, and when Ru is used, it is preferably set within the range of 9.5 Å to 20 Å.

Furthermore, even when Rh, Ir, Cu, Ag, Au, Pt or Pd is used as a constituent material for the exchange-coupling transmitting layer 241 and the exchange-coupling adjustment layer 243, their thickness can be set as similar to Ru and Cu.

Further, the thickness of the exchange-coupling functional layer 81 between the upper shield layer 3 and the side shield layer 7 (see FIG. 1) and the thickness of the exchange-coupling functional layer 70 between the first side shield layer 71a and the second side shield layer 71b (see FIG. 6A) can also be set as similar to the above.

First Antiferromagnetic Body Layer and Second Antiferromagnetic Body Layer

The first antiferromagnetic body layer 5 and the second antiferromagnetic body layer 6 that are formed adjacent to the upper shield layer 3 and the lower shield layer 4, respectively, fulfill a function to pin the directions of the magnetization of the upper shield layer 3 and the lower shield layer 4 by the exchange-coupling with the upper shield layer 3 and the lower shield layer 4, respectively.

As the constituent material for the first antiferromagnetic body layer 5 and the second antiferromagnetic body layer 6, an antiferromagnetic material containing at least one type of element to be selected from a group of Pt, Ru, Rh, Pd, Ni, Cu, Ir, Cr and Fe, and, Mn can be used. The content of Mn in this antiferromagnetic material is preferably 35% to 95% of atom.

The first antiferromagnetic body layer 5 is configured so as to present lower blocking temperature ($Tb_5$) than the blocking temperature ($Tb_6$) of the second antiferromagnetic body layer 6.

The magnetizations 3a and 4a of the upper shield layer 3 and the lower shield layer 4 can be pinned in a state where they are inclined at the predetermined angles $\theta_3$ and $\theta_4$ by having the blocking temperature of the first antiferromagnetic body layer 5 and that of the second antiferromagnetic body layer 6 in such relationship ($Tb_5<Tb_6$), and, by manufacturing the MR element 1 with a method described later.

For example, the blocking temperature ($Tb_5$) of the first antiferromagnetic body layer 5 can be lower than the blocking temperature ($Tb_6$) of the second antiferromagnetic body layer 6 by setting the thickness (Z direction) of the first antiferromagnetic body layer 5 to be smaller than the thickness (Z direction) of the second ferromagnetic body layer 6. Preferably, the thickness of the first antiferromagnetic body layer 5 can be set within the range of 40 Å to 90 Å, and the thickness of the second antiferromagnetic body layer 6 can be set within the range of 100 Å to 150 Å.

Among the antiferromagnetic materials, there are non-heat treatment type antiferromagnetic materials that indicate antiferromagnetism without requiring any heat treatment, and that induce an exchange-coupling magnetic field in between a ferromagnetic material, and, heat treatment type antiferromagnetic materials that will indicate antiferromagnetism by a heat treatment. In the present embodiment, as the constituent materials for the first antiferromagnetic body layer 5 and the second antiferromagnetic body layer 6, either type of antiferromagnetic materials is usable. As the non-heat treatment type antiferromagnetic materials, RuRhMn, FeMn and IrMn are exemplified, and as the heat treatment type antiferromagnetic materials, PtMn, NiMn and PtRhMn are exemplified.

[Detection Operation of External Magnetic Field by MR Element]

Figure 11A:
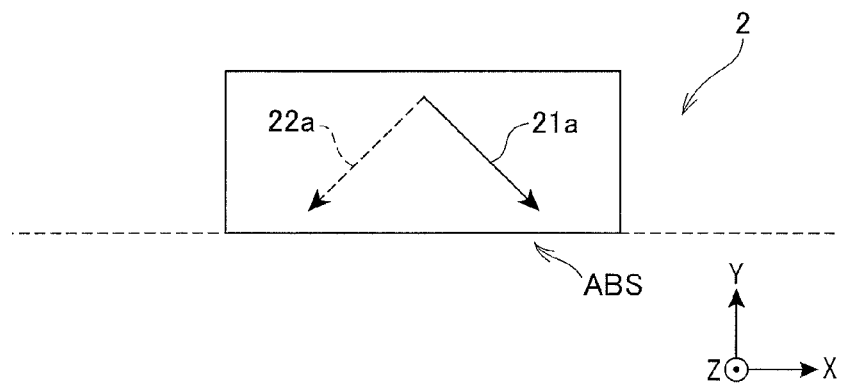
FIGS. 11A to 11C are model diagrams showing a state variation of the magnetization where a magnetoresistive effect can be obtained in the MR element relating to one embodiment of the present invention according to an external magnetic field, respectively.
Figure 11B:
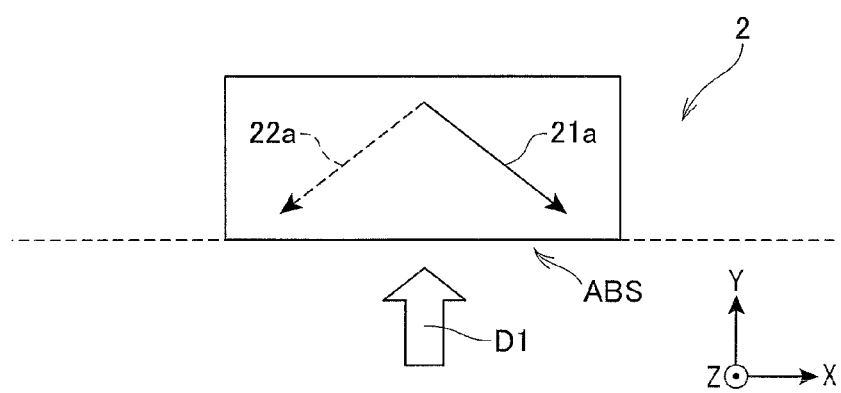
Figure 11C:
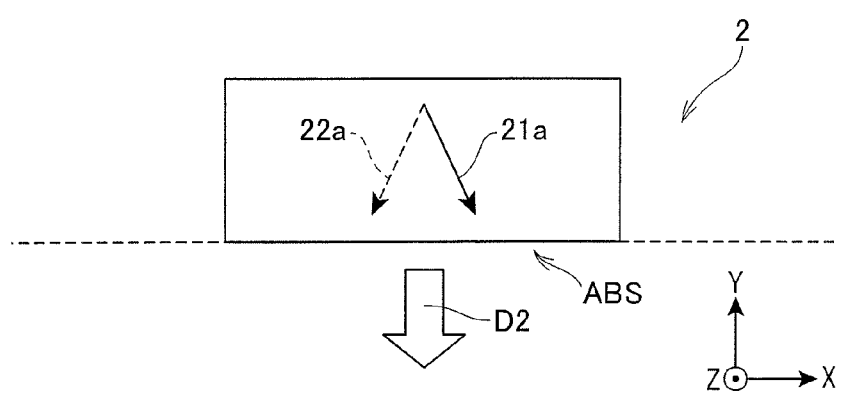

With reference to FIG. 11A to FIG. 11C, the detection operation of an external magnetic field by the MR element 1 relating to the present embodiment is explained.

As described above, because the first antiferromagnetic layer 21 and the second ferromagnetic layer 22 are indirectly magnetically coupled with the upper shield layer 3 and the lower shield layer 4 where their magnetizations 3a and 4a are substantially orthogonalized, respectively, the magnetizations 21a and 22a of the first ferromagnetic layer 21 and the second ferromagnetic layer 22 are substantially orthogonalized (see FIG. 11A). This state is an initial state as the MR element (MR part 2).

As shown in FIG. 11B, when the external magnetic field D1 flowing into the element side from ABS is detected, the magnetization 21a of the first ferromagnetic layer 21 and the magnetization 22a of the second ferromagnetic layer 22 tend to be inclined in the opposite directions from each other, and the resistance of the element becomes greater.

In the meantime, as shown in FIG. 11C, when the external magnetic field D2 in the direction away from ABS is detected, the magnetization 21a of the first ferromagnetic layer 21 and the magnetization 22a of the second ferromagnetic layer 22 tend to be orientated toward the same direction, and the resistance of the element becomes smaller.

The external magnetic field can be detected by measuring a series of resistive changes relative to such external magnetic field.

[Manufacturing Method for MR Element]

A manufacturing method for the MR element 1 having the configuration above is explained with reference to drawings. Furthermore, in the present specification, manufacturing steps for the MR element having the configuration shown in FIG. 1 as one example are explained.

FIGS. 12A to 12D are perspective views schematically showing steps to manufacture the MR element relating to one embodiment of the present invention, respectively, and FIGS. 13A to 13D are perspective views schematically showing a first annealing process and a second annealing process out of steps to manufacture the MR element relating to the present embodiment of the present invention.

Figure 12A:
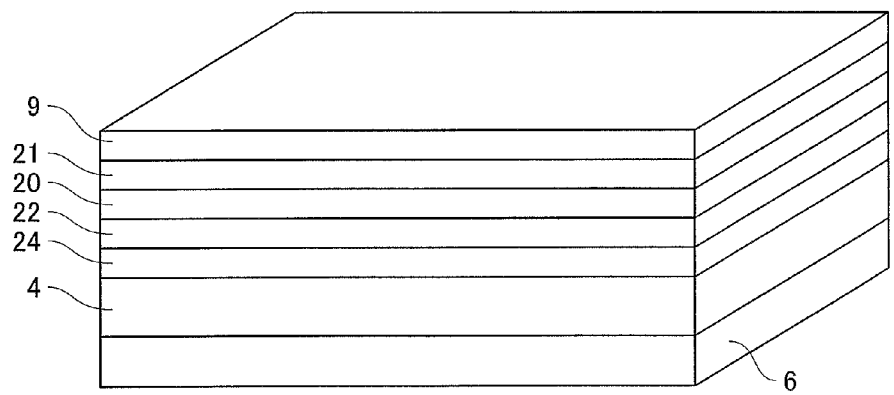
FIGS. 12A to 12D are perspective views schematically showing steps to manufacture the MR element relating to one embodiment of the present invention, respectively.
Figure 12A:
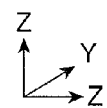
Figure 12B:
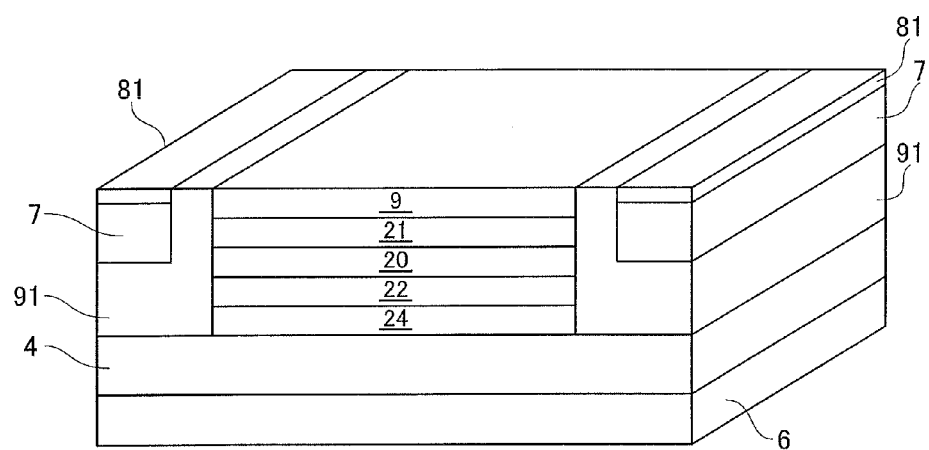
Figure 12B:
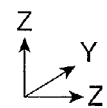
Figure 12C:
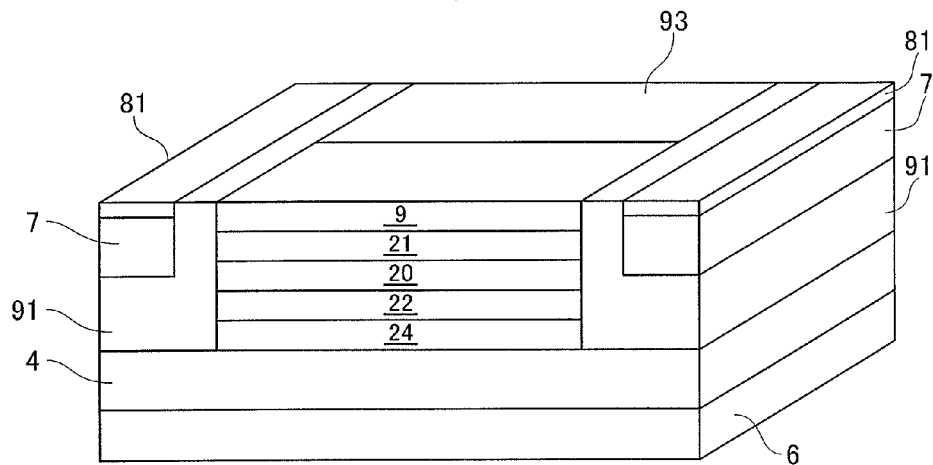
Figure 12C:
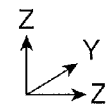

First, the lower shield layer 4, the exchange-coupling functional gap layer 24, the second ferromagnetic layer 22, the nonmagnetic intermediate layer 20, the first ferromagnetic layer 21 and the cap layer 9 are lamination-formed on the second antiferromagnetic body layer 6 in respective order (see FIG. 12A). Each layer of these (each layer from the second antiferromagnetic body layer 6 to the cap layer 9) can be formed, for example, using a pattern plating including a frame plating method or sputtering method or the like.

Figure 13A:
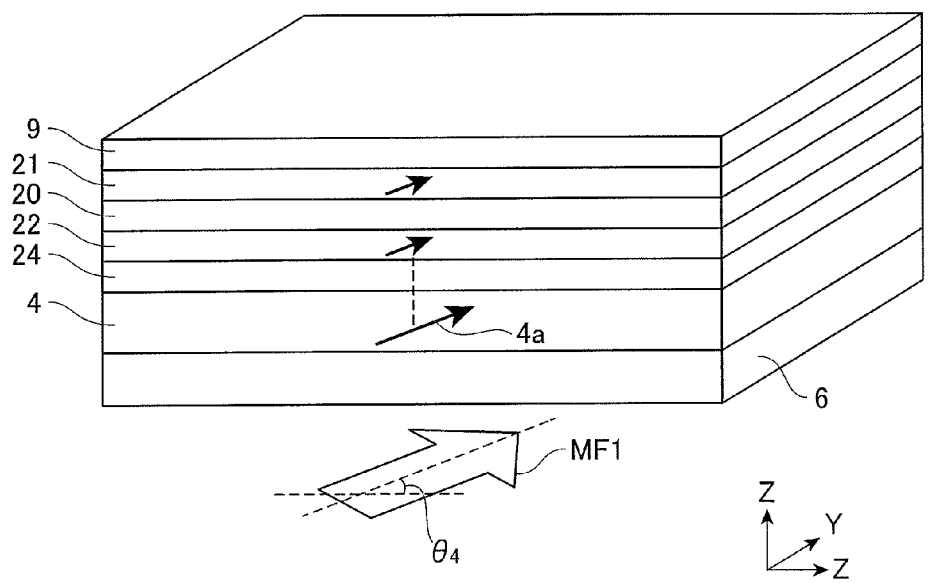
FIGS. 13A to 13D are perspective views schematically showing annealing treatment process (a first annealing treatment process and a second annealing treatment process) out of processes to manufacture the MR element relating to one embodiment of the present invention, respectively.
Figure 13B:
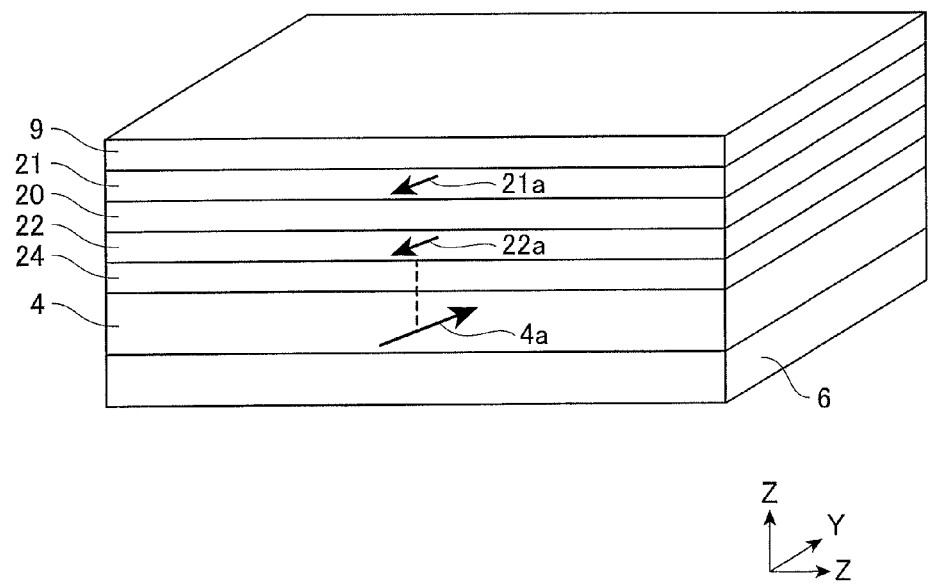

Next, while annealing process is applied to the multilayer body formed as mentioned above (multilayer body shown in FIG. 12A), a magnetic field MF1 is applied to a predetermined direction (a direction at the predetermined angle $\theta_4$ relative to track width direction) (first annealing process, see FIG. 13A). In the example shown in FIG. 14A, the magnetic field MF1 is applied to a direction, which is from the front left toward the right back side viewing from ABS side, and which is at an angle of approximately 80 degrees relative to ABS.

At this time, annealing temperature T1 is set to be higher than the blocking temperature ($Tb_6$) of the second antiferromagnetic body layer 6 (T1>$Tb_6$). The magnetization 4a of the lower shield layer 4 on the antiferromagnetic body layer 6 can be orientated toward the direction of the magnetic field MF1 by setting the annealing temperature T1 to be higher than the blocking temperature ($Tb_6$) of the second antiferromagnetic body layer 6. In the meantime, as far as the annealing temperature T1 being higher than the blocking temperature ($Tb_6$) of the second antiferromagnetic body layer 6, its upper limit value can be appropriately set according to a constituent material of each layer (particularly the lower shield layer 4), and it is preferably set at less than 300° C. When NiFe is used as a constituent material for the lower shield layer 4, if the annealing temperature T1 exceeds 300° C., roughness of the lower shield layer 4 is likely to be deteriorated.

The intensity of the magnetic field MF1 to be applied to the multilayer body (multilayer body shown in FIG. 12A) in the first annealing process is not particularly restricted as long as it is a sufficient magnetic field so as to saturate the magnetization 4a of the lower shield layer 4 in the direction of the magnetic field MF1, and for example, it can be set at approximately 3 kOe.

Thus, when the magnetic field MF1 is applied while the annealing process is implemented, if the magnetization 4a of the lower shield layer 4 is brought to a saturated state in the direction of the magnetic field MF1, the magnetizations 21a and 22a of the first ferromagnetic layer 21 and the second magnetic layer 22 shall be orientated toward the direction of the magnetic field MF1. Then, when the temperature of the multilayer body described above (the multilayer shown in FIG. 12A) is decreased and the temperature becomes the blocking temperature ($Tb_6$) of the second antiferromagnetic body layer 6 or less, the orientation of the magnetization 4a of the lower shield layer 4 is pinned to the direction of the magnetic field MF1. Further, in the second ferromagnetic layer 22 that is indirectly magnetically coupled with the lower shield layer 4 via the exchange-coupling functional gap layer 24, the direction of its magnetization 22a is in an antiparallel state to the direction of the magnetization 4a of the lower shield layer 4 (see FIG. 13B).

Next, a photoresist film is formed so as to cover the cap layer 9 and it is patterned, and a portion where no photoresist film exists is etched until the upper surface of the lower shield layer 4 is exposed using a dry etching method with a residual photoresist film as a mask. Then, the insulating layer 91 made of $Al_2O_3$ is formed in the portion removed by etching, for example, using a sputtering method, and after a portion of the insulating layer 91 is etched using a dry etching method, such as ion milling, the side shield layer 7 is formed and the exchange-coupling functional layer 81 is formed (see FIG. 13B). With this step, the width of the MR part 2 in the track width direction (X direction) is defined.

Subsequently, a photoresist film is formed so as to cover the cap layer 9, the insulating layer 91 and the exchange-coupling functional layer 81 is patterned, and a portion where no photoresist film exists (a back side portion than ABS in the multilayer body from the exchange-coupling functional gap layer 24 to the cap layer 9) using a dry etching method, such as ion milling, with the residual photoresist film as a mask until the upper surface of the lower shield layer 4 is etched. Then, the insulating layer 93 made of $Al_2O_3$ is formed in a portion removed by etching (see FIG. 15A). With this step, height (MR height (MR-h)) in the MR part 2 in the direction perpendicular to ABS (Y direction) is defined.

Figure 12D:
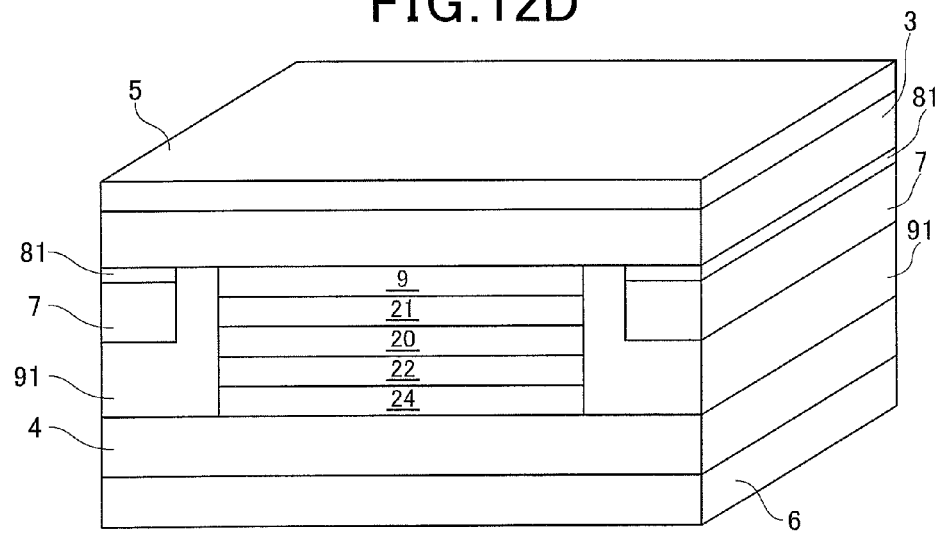
Figure 12D:
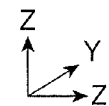

Then, the upper shield layer 3 and the first antiferromagnetic body layer 5 are lamination-formed so as to cover the cap layer 9, the insulating layer 91, the exchange-coupling functional layer 81 and the insulating layer 93, over them in respective order (see FIG. 12D).

Figure 13C:
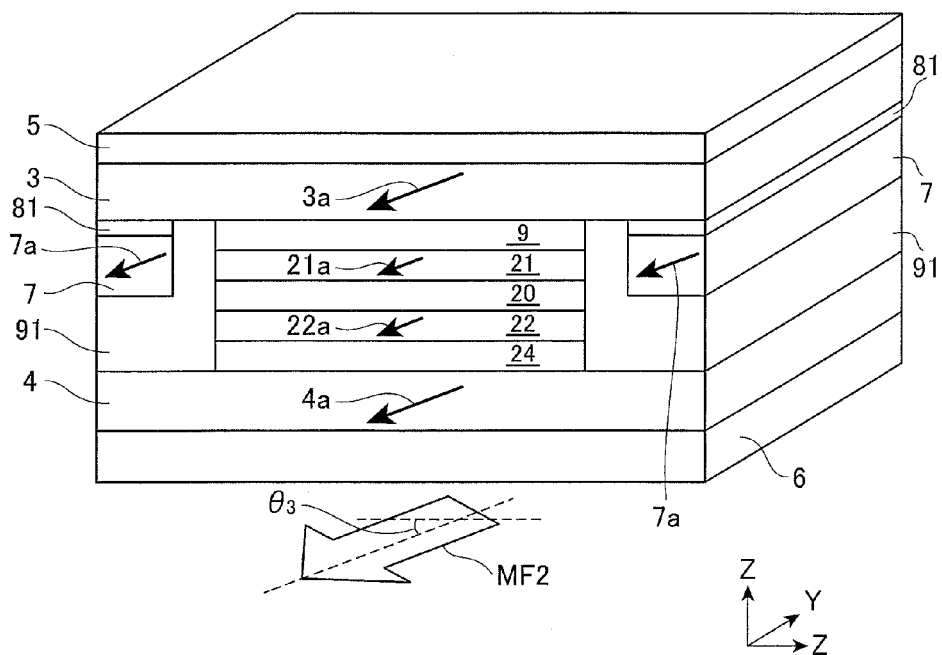
Figure 13D:
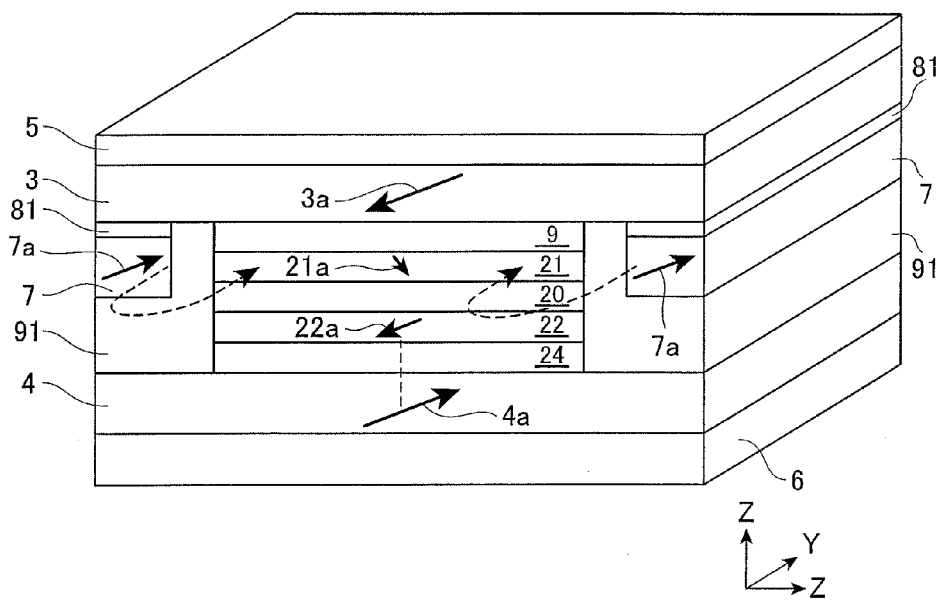

While the annealing process is applied to the multilayer body (multilayer body shown in FIG. 12D) formed as described above, a magnetic field MF2 is applied in a predetermined direction (direction at the predetermined angle $\theta_3$ relative to the track width direction) (second annealing process, see FIG. 13C). In the example shown in FIG. 13C, the magnetic field MF2 is applied in a direction, which is toward front left from the right back side from the ABS side, and which is at the angle of approximately 20 degrees relative to ABS.

At this time, the annealing temperature T2 is set to be less than the blocking temperature ($Tb_6$) of the second antiferromagnetic body layer 6 and to be higher temperature than the blocking temperature ($Tb_5$) of the first antiferromagnetic body layer 5 ($Tb_5 < T2 < Tb_6$). The magnetization 3a of the upper shield layer 3 can be orientated toward the direction of the magnetic field MF2 by setting the annealing temperature T2 to be higher than the blocking temperature ($Tb_5$) of the first antiferromagnetic body layer 5. In the meantime, if the annealing temperature T2 exceeds the blocking temperature ($Tb_6$) of the second antiferromagnetic body layer 6, the magnetization direction of the lower shield layer 4 pinned in the direction at the predetermined angle $\theta_4$ due to the first annealing process shall be pinned in the direction of the magnetic field MF2 in the second annealing process, and the magnetization 4a of the lower shield layer 4 is likely not to enable to incline at the predetermined angle $\theta_4$. Consequently, the direction of the magnetization 4a of the lower shield layer 4 after the second annealing process can be maintained at a pinned state to the direction at the predetermined angle $\theta_4$ by setting the annealing temperature T2 to be less than the blocking temperature ($Tb_6$) of the second antiferromagnetic body layer 6.

In the second annealing process, the intensity of the magnetic field MF2 applied to the multilayer body (the multilayer body shown in FIG. 12D) is not particularly restricted as long as it is a sufficient magnetic field so as to saturate the magnetization 3a of the upper shield layer 3 in the direction of the magnetic field MF2, and it can be set at, for example, approximately 3 kOe.

When the magnetic field MF2 is applied while the second annealing process is implemented as mentioned above and the magnetization 3a of the upper shield layer 3 is saturated in the direction of the magnetic field MF2, the directions of the magnetizations 7a, 21a, 22a and 4a of the side shield layer 7, the first ferromagnetic layer 21, the second ferromagnetic layer 22 and the lower shield layer 4 shall also be orientated toward the direction of the magnetic field MF2 (see FIG. 13C). Then, when the temperature of the multilayer body (multilayer body shown in FIG. 12D) is decreased and becomes the blocking temperature ($Tb_5$) of the first antiferromagnetic body layer 5 or less, the orientation of the magnetization 3a of the upper shield layer 3 is pinned to the direction of the magnetic field MF2. Along with this, in the side shield layer 7 that is magnetically coupled with the upper shield layer 3 via the exchange-coupling functional layer 81, the direction of its magnetization 7a becomes antiparallel to the direction of the magnetization 3a of the upper shield layer 3.

Thus, the direction of the magnetization 4a of the lower shield layer 4 can be pinned to the direction at the predetermined angle $\theta_4$ by the first annealing process for heating while the magnetic field MF1 is applied in the direction at the predetermined angle $\theta_4$ before the upper shield layer 3 is formed. After that, the upper shield layer 3 is formed, and the direction of the magnetization 3a of the upper shield layer 3 can be pinned to the direction at the predetermined angle $\theta_3$ by the second annealing process for heating while the magnetic field MF2 is applied to the direction at the predetermined angle $\theta_3$. Because the annealing temperature T2 in this annealing process is less than the blocking temperature ($Tb_6$) of the second antiferromagnetic layer 6 for pinning the magnetization 4a of the lower shield layer 4, the direction of the magnetization 4a of the lower shield layer 4 after the second annealing process becomes a direction that is remained to be pinned by the first annealing process. Consequently, the magnetizations 3a and 4a of the upper shield layer 3 and the lower shield layer 4 can be inclined at the predetermined angles $\theta_3$ and $\theta_4$, respectively. Then, the magnetization 21a of the first ferromagnetic layer 21 is inclined at the predetermined angle $\theta_{21}$ by the application of a bias magnetic field from the side shield layer 7 where its magnetization 7a is inclined at the predetermined angle $\theta_7$, and the magnetization 22a of the second ferromagnetic layer 22 is inclined at the predetermined angle $\theta_{22}$ by the application of the bias magnetic field from the side shield layer 7 and by the indirect magnetic coupling with the lower shield layer 4. As a result, the magnetizations 21a and 22a of the first ferromagnetic layer 21 and the second magnetic layer 22 can be substantially orthogonalized.

According to the MR element 1 relating to the present embodiment manufactured as mentioned above, even if a bias magnetic field application part (such as a permanent magnet) for applying the bias magnetic field to the first ferromagnetic layer 21 and the second ferromagnetic layer 22 does not exist in the Y-direction back side region side of them, the magnetizations 21a and 22a of the first ferromagnetic layer 21 and the second ferromagnetic layer can substantially be orthogonalized, i.e., can be in the initial state.

[Thin Film Magnetic Head]

Figure 14:
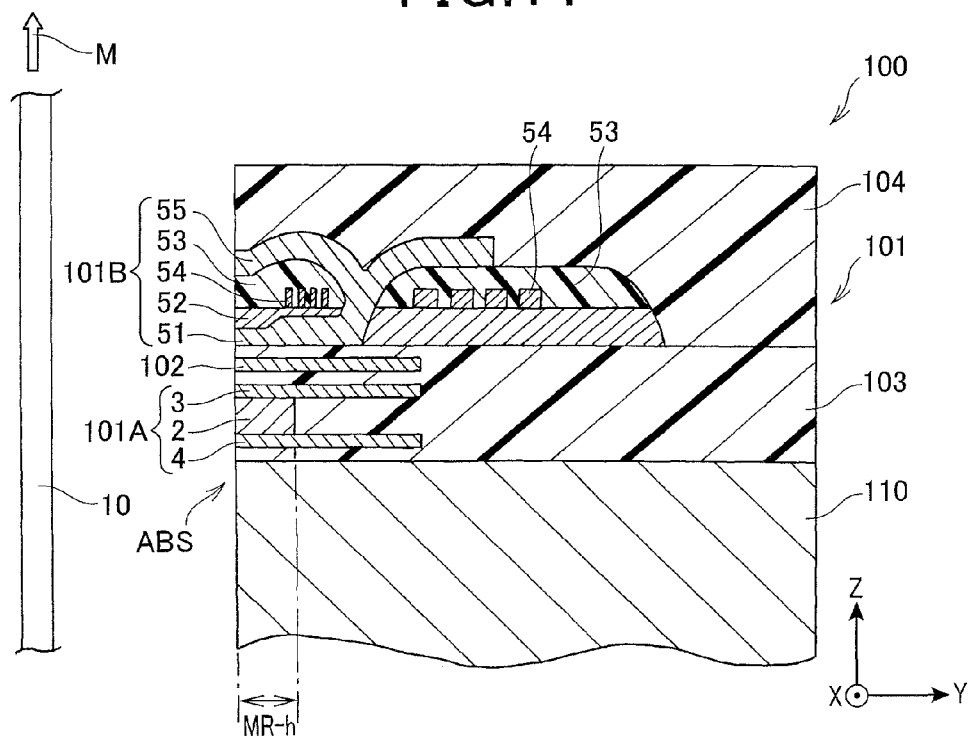
FIG. 14 is a cross-sectional view in a plane that is orthogonal to ABS, schematically showing the configuration of a thin film magnetic head in one embodiment of the present invention.

Next, an entire structure of the thin film magnetic head in the present embodiment is explained with reference to FIG. 14. FIG. 14 is a cross-sectional view (a cross-sectional view on the YZ plane) that is orthogonalized with ABS of the thin film magnetic head in the present embodiment.

As shown in FIG. 14, a thin film magnetic head 100 is used by loading onto a magnetic recording apparatus, such as a hard disk drive, for implementing the magnetic process to a recording medium 10, such as a hard disk, moving in a medium traveling direction M.

The thin film magnetic head 100 shown in FIG. 14 is a so-called composite head where both the recording process and the reproducing process are executable as magnetic processes. In the thin film magnetic head 100, a magnetic head part 101 is formed on a slider substrate 110 made of a ceramic material, such as AlTiC ($Al_2O_3 \cdot TiC$).

The magnetic head part 101 has a configuration where a reproducing head part 101A for a reproducing process of recorded magnetic information by utilizing a magneto-resistive (MR) effect and a shield-type recording head part 101B for executing a recording process in a perpendicular recording system are laminated in respective order.

The reproducing head part 101A has a multilayer structure where the lower shield layer 4, the MR part 2 and the upper shield layer 3 are laminated in respective order, and is configured with the MR element 1 (see FIG. 1 to FIG. 11) relating to the present embodiment where the side shield layers 7 are established at both sides of the MR part 2 in the track width direction (X direction). Furthermore, the lower shield layer 4, the MR part 2, the upper shield layer 3 and the side shield layer 7 form a portion of ABS. Then, the height in a direction perpendicular to ABS (Y direction) in the MR part becomes MR height (MR-h).

An interelement shield layer 102 made of the similar material to the upper shield layer 3 is formed between the upper shield layer 3 and the recording head part 101B.

The interelement shield layer 102 fulfills roles to cut off the MR part 2 functioning as a sensor from a magnetic field that is generated from the recording head part 101B, and to prevent exogenous noise on the occasion of reading. Further, a bucking coil part can be further formed between the interelement shield layer 102 and the recording head part 101B. The packing coil part is for generating a magnetic flux that is generated from the recording head part 101B, and that overrides a magnetic flux loop via the upper and lower electrode layers of the MR part 2, and acts so as to suppress unnecessary writing to the recording medium 10 or a wide area adjacent tracks erasure (WATE) phenomenon, which is an erasure action.

An insulating layer 103 made of alumina is formed in a space between the upper shield layer 3 and the lower shield layer 4 at the opposite side from ABS of the MR part 2; a back side part at the opposite from ABS of the upper shield layer 3, the lower shield layer 4 and the interelement shield layer 102; a space between the lower shield layer 4 and the slider substrate 110; and a space between the interelement shield layer 102 and the recording head part 101B, respectively.

The recording head part 101B is preferably configured for perpendicular magnetic recording, and as shown in FIG. 14, has a main magnetic pole layer 51, a gap layer 52, a coil insulating layer 53, a coil layer 54 and an auxiliary magnetic pole layer 55.

The main magnetic pole layer 51 is configured as a magnetic guide path for guiding a magnetic flux induced by the coil layer 54 while the magnetic flux is focused to the recording layer in the recording medium 10 to be written. Herein, in the end part of the ABS of the main magnetic pole layer 51, it is preferable to set the width in the track width direction (X direction in FIG. 14) and the thickness in the lamination direction (Z direction in FIG. 14) to be smaller than other portions. With this setting, it becomes possible to generate a minute and strong magnetic field for writing corresponding to high recording density.

A trailing shield part where its layer cross section is wider than other portions of the auxiliary magnetic pole layer 55 is formed at the end of the auxiliary magnetic pole layer 55 that is magnetically coupled with the main magnetic pole layer 51 at the ABS side. As shown in FIG. 14, the auxiliary magnetic pole layer 55 is arranged opposing to the end part of the main magnetic pole layer 51 at the ABS side interposing the gap layer 52 and the coil insulating layer 53 made of an insulating material, such as alumina.

The magnetic field gradient can be precipitous between the auxiliary magnetic pole layer 55 and the main magnetic pole layer 51 in the vicinity of ABS by establishing such auxiliary magnetic pole layer 55. With this design, any jitter of the signal output becomes smaller and an error rate upon reading can be minimized.

The auxiliary magnetic pole layer 55 is formed to be, for example, approximately 0.5 μm to 5 μm of thickness, using, for example, a frame plating method or a sputtering method. As a constituent material for the auxiliary magnetic pole layer 55, for example, an alloy made of any two or three of Ni, Fe and Co, or, an alloy where a predetermined element(s) is added using these three are main components can be exemplified.

The gap layer 52 is formed so as to separate the coil layer 54 and the main magnetic pole layer 51. The gap layer 52 is formed using, for example, a sputtering method or a CVD method or the like, for example with $Al_2O_3$, diamond-like carbon (DLC) or the like with approximately 0.01 μm to 0.5 μm of thickness.

The insulating layer 104 made of alumina is formed so as to cover the periphery of the recording head part 101B.

[Head Gimbal Assembly (HGA) and Hard Disk Apparatus]

Subsequently, a head gimbal assembly (HGA) used by mounting the thin film magnetic head 100 in the present invention, and a hard disk apparatus are explained.

Figure 15:
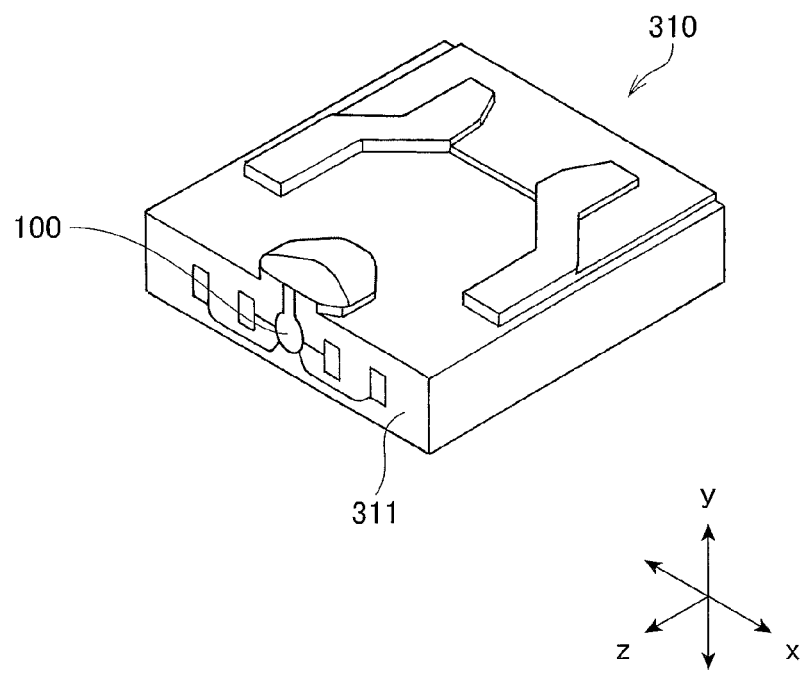
FIG. 15 is a perspective view showing a slider included in the HGA in one embodiment of the present invention.

First, with reference to FIG. 15, a slider 310 included in the HGA is explained. In the hard disk apparatus, the slider 310 is arranged so as to be opposite to a hard disk, which is a disk recording medium that is rotation-driven. This slider 310 includes a base substrate mainly composed with a substrate and overcoat.

The base substrate 311 has a substantially hexahedron shape. One plane out of six planes in the base substrate 311 is designed to be opposite to the hard disk. ABS is formed on this one plane.

When the hard disk rotates in the z direction in FIG. 15, lifting force occurs downward in the y direction in FIG. 15 to the slider 310 by an aerial flow passing through between the hard disk and the slider 310. The slider 310 is designed to float above the surface of this hard disk due to this lifting force. Furthermore, the x direction in FIG. 15 is the track width direction of the hard disk.

The thin film magnetic head 100 in the present embodiment is formed in the vicinity of the end part of the slider 310 at the air outflow side (lower left end portion in FIG. 15).

Figure 16:
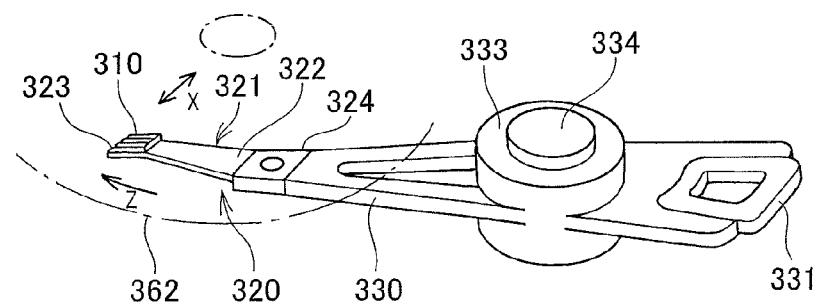
FIG. 16 is a perspective view showing a head arm assembly including the HGA in one embodiment of the present invention.

Next, with reference to FIG. 16, a head gimbal assembly (HGA) 320 in the present embodiment is explained. The HGA 320 includes the slider 310 and a suspension 321 that elastically supports this slider 310. The suspension 321 has a plate spring-state load beam 322 formed with stainless steel; a flexure 323 that is established at one end part of this load beam 322, and where the slider 310 is joined, and that provides an appropriate degree of freedom to the slider 310; and a base plate 324 established at the other end of the load beam 322.

The base plate 324 is designed to be mounted to an arm 330 of an actuator for moving the slider 310 in the track crossing direction x of the hard disk 362. The actuator has the arm 330 and a voice coil motor that drives this arm 330. In the flexure 323, a gimbal part for constantly maintaining the posture of the slider 310 is established in a portion where the slider is mounted.

The HGA 320 is mounted to the arm 330 of the actuator. A member where the HGA 320 is mounted to one arm 330 is referred to as a head arm assembly. Further, a member where the HGA 320 is mounted to each arm of a carriage having a plurality of arms is referred to as a head stack assembly.

FIG. 16 shows one example of the head arm assembly. The HGA 320 is mounted to one end portion of the arm 330. A coil 331 to be a portion of the voice coil motor is mounted to the other end part of the arm 330. A bearing part 333 to be mounted to an axis 334 for turnably supporting the arm 330 is established in the intermediate portion of the arm 330.

Figure 17:
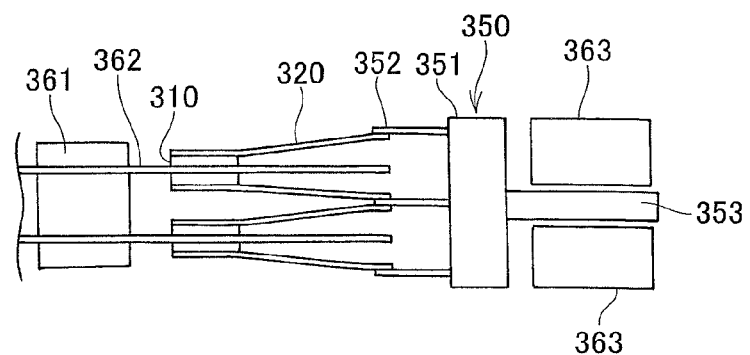
FIG. 17 is an explanatory view showing a primary part of a hard disk device in one embodiment of the present invention.
Figure 18:
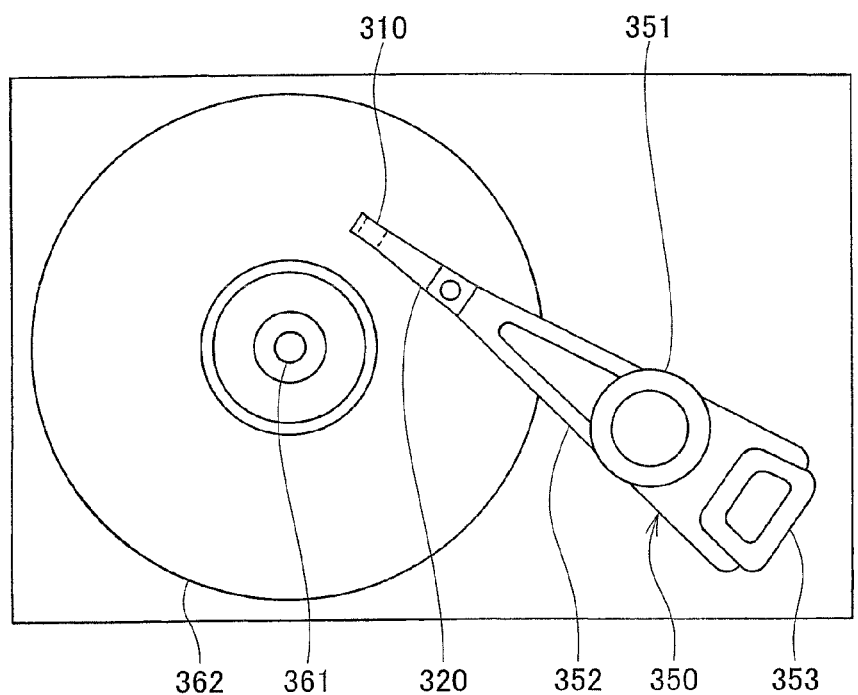
FIG. 18 is a plan view showing the hard disk device in one embodiment of the present invention.

Next, with reference to FIG. 17 and FIG. 18, one example of the head stack assembly and a hard disk apparatus in the present embodiment are explained.

FIG. 17 is an explanatory diagram showing a main part of the hard disk apparatus, and FIG. 18 is a plan view of the hard disk apparatus.

The head stack assembly 350 has a carriage 351 with a plurality of arms 352. A plurality of HGAs 320 are mounted so as to align in the perpendicular direction at intervals with each other. In the carriage 351, the coil 353 to be a portion of the voice coil motor is mounted at the opposite side of the arms 352. The head stack assembly 350 is incorporated into the hard disk apparatus.

The hard disk apparatus has a plurality of hard disks 362 mounted in a spindle motor 361. The two sliders 310 are arranged in each hard disk 362 so as to be opposite across the hard disk 362. Further, the voice coil motor has a permanent magnet 363 arranged at an opposite position across the coil 353 of the head stack assembly 350.

The head stack assembly 350 excluding the sliders 310 and the actuator support the sliders 310 corresponding to a positioning device in the present embodiment, and, they position the sliders 310 relative to the hard disks 362.

In the hard disk apparatus in the present embodiment, the slider 310 is moved in the track crossing direction of the hard disk 362 by the actuator, and the slider 310 is positioned relative to the hard disk 362.

The thin film magnetic head 100 (see FIG. 14) included in the slider 310 records information into the hard disk 362 by the recording head part 101B (see FIG. 14), and reproduces the information recorded in the hard disk 362 by the reproducing head part 101A (see FIG. 14).

The embodiment explained above is described in order to make the understanding of the present invention easier, and it is not described in order to restrict the present invention. Therefore, each element disclosed in the embodiment above is a concept including all design variations and equivalents belonging to the technical scope of the present invention, as well.

In the embodiment above, the cap layer 9 in order not to magnetically couple the upper shield layer 3 with the first ferromagnetic layer 21 is established between them, but the present invention is not restricted to such mode, but the upper shield layer 3 and the first ferromagnetic layer 21 can be magnetically coupled without establishing the cap layer 9. In this case, the upper shield layer 3 and the first ferromagnetic layer 21 can be directly magnetically coupled, and the exchange-coupling gap layer 24 is established in between them and they can be indirectly magnetically coupled.

In the embodiment above, the composite type thin film magnetic head having the reproducing head part 101A and the recording head part 101B laminated onto the reproducing head part was explained as an example, but the present invention shall not be restricted to such mode. For example, the composite type thin film magnetic head can have the recording head part 101B and the reproducing head part 101A laminated onto the recording head part, i.e., the lamination order of these can be opposite. Further, the MR element 1 relating to the embodiment above is also applicable to a thin film head exclusive for reproducing not including the recording head 101B, but including only the reproducing head part 101A.

EXAMPLES

Hereafter, the present invention will be explained in further detail by exemplifying experimental examples, but the present invention should not be limited to the experimental examples below.

Experimental Example 1

For the angle $\theta_{21}$ of the magnetization 21a of the first ferromagnetic layer 21 when the angle $\theta_2$ of the magnetization 7a of the side shield layer 7 in the MR element 1 having the configuration shown in FIG. 4 was fluctuated within a predetermined range, a simulation analysis experiment (calculation of an angle of magnetization by LLG simulation) was conducted.

In the MR element 1 used in this simulation analysis experiment, the first upper shield layer 31, the second upper shield layer 32 and the side shield layer 7 were all regarded as magnetization pinned layers where the angles $\theta_3$ and $\theta_7$ of their magnetizations 31a, 32a and 7a were pinned at a predetermined angle(s), respectively. Further, the first lower shield layer 41 and the second lower shield layer 42 were regarded as magnetization pinned layers where the angle $\theta_4$ of their magnetizations 41a and 42a were pinned to 45 degrees, respectively, and the magnetizations 41a and 42a were in an antiparallel state to each other. In addition, the second ferromagnetic layer 22 was regarded as a magnetization pinned layer where the angle $\theta_{22}$ of the magnetization 22a was pinned to 45 degrees. Furthermore, the dimensions of the MR element 1 are shown in Table 1.

TABLE 1

| Lamination structure | | Width (dimensions in X direction, nm) | Length (dimensions in Y direction, nm) | Thickness (dimensions in Z direction, nm) |
|---|---|---|---|---|
| First antiferromagnetic body layer (5) | | 480 | 400 | 5 |
| First upper shield layer (31) | | 480 | 400 | 12.5 |
| Second upper shield lwyer (32) | | 480 | 400 | 12.5 |
| Cap layer (9) | | 35 | 35 | 0.8 |
| Magnetto-resistive effect part (2) | First ferromagnetic layer (21) | 35 | 35 | 5.0 |
| | Nonmagnetic intermediate layer (20) | 35 | 35 | 1.0 |
| | Second ferromagnetic layer (22) | 35 | 35 | 5.0 |
| | Exchange-coupling functional gap layer (24) | 35 | 35 | 0.8 |
| First lower shield layer (41) | | 480 | 400 | 12.5 |
| Second lower shield layer (42) | | 480 | 400 | 12.5 |
| Second antiferromagnegnetic body layer (6) | | 480 | 400 | 10 |
| Side shield layer (7) | | 35 | 220.4 | 7.0 |
| Exchange-coupling functional layer (81) | | 35 | 220.4 | 0.8 |

Figure 19:
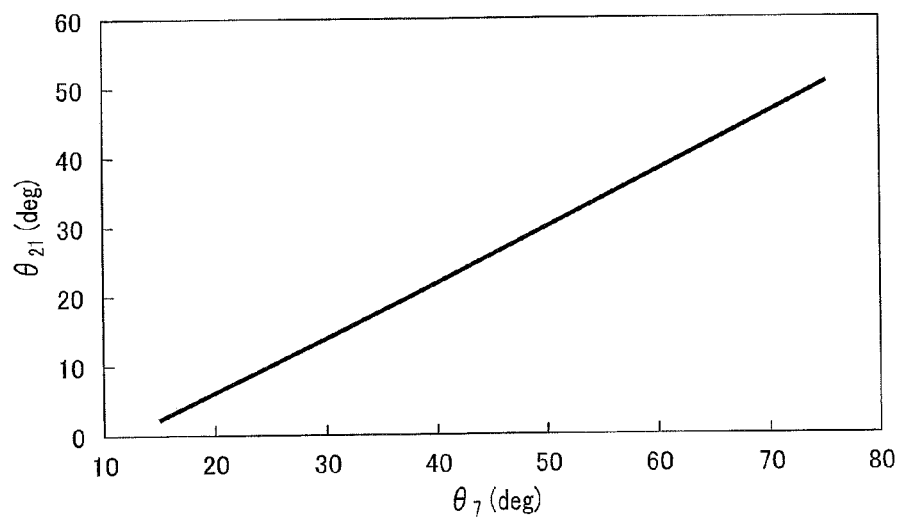
FIG. 19 is a graph showing a simulation result in Experimental Example 1.

A graph showing a result of this simulation analysis experiment is shown in FIG. 19. From the graph shown in FIG. 19, when angle $\theta_7$ of the magnetization 7a of the side shield layer 7 was set at 15 degrees to 75 degrees, preferably at 45 degrees to 74 degrees and particularly at 68.3 degrees, it was confirmed that the angle $\theta_{21}$ of the magnetization 21a of the first ferromagnetic layer 21 would be controllable at approximately 45 degrees.

Experimental Example 2

In the MR element 1 of Experimental example 1, without pinning the angle $\theta_{22}$ of the magnetization 22a of the second ferromagnetic layer 22, the simulation analysis experiment (calculation of an angle of magnetization by the LLG simulation) was conducted as similar to Example 1.

In the MR element 1 used in this simulation analysis experiment, the first upper shield layer 31, the second upper shield layer 32 and the side shield layer 7 were regarded as magnetization pinned layers where the angles $\theta_3$ and $\theta_7$ of the magnetizations 3a and 7a were pinned to 68.3 degrees. Further, the first lower shield layer 41 and the second lower shield layer 42 were regarded as magnetization pinned layers where the angle $\theta_4$ of their magnetizations 41a and 42a was pinned to a predetermined angle.

Furthermore, the intensity of exchange-coupling J (erg/cm²) between the second lower shield layer 42 and the second ferromagnetic layer 22 in the MR element 1 was set at −0.2 erg/cm².

Figure 20:
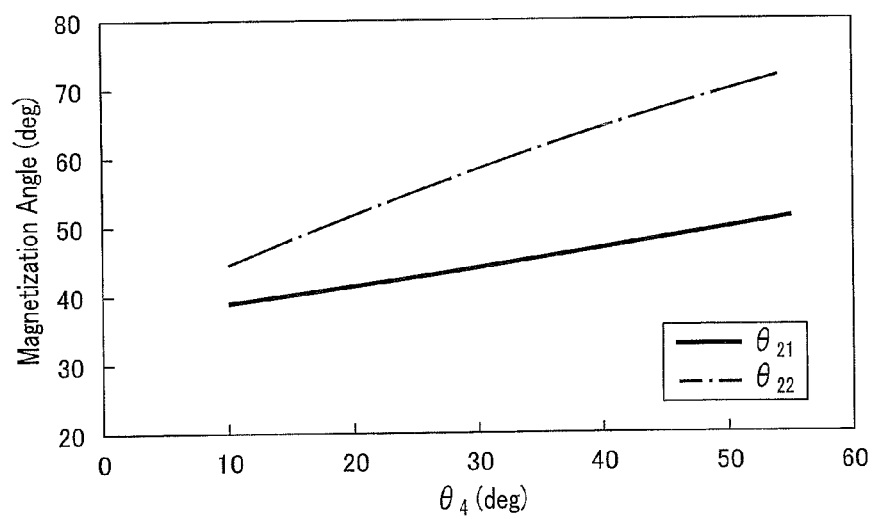
FIG. 20 is a graph showing a simulation result in Experimental Example 2.

A graph showing a result of this simulation analysis experiment is shown in FIG. 20. According to the graph shown in FIG. 20, even if the angle $\theta_4$ of the magnetization 42a of the second lower shield layer 42 was set at 45 degrees, the angle $\theta_{22}$ of the magnetization 22a of the second ferromagnetic layer 22 would not be 45 degrees, and it was confirmed that the angle $\theta_{22}$ of the magnetization 22a of the second ferromagnetic layer 22 was controllable at 45 degrees by setting the angle $\theta_4$ of the magnetization 42a of the second lower shield layer 42 at 10 degrees. From this simulation result, in the MR element 1 of Experimental example 2 (Experimental example 1), it became ascertained that a bias magnetic field was applied to the second ferromagnetic layer 22 along with the first ferromagnetic layer 21, from the side shield layer 7.

Experimental Example 3

In the MR element 1 shown in FIG. 4 and FIG. 6A, for the angles $\theta_{21}$ and $\theta_{22}$ of the magnetizations 21a and 22a of the first ferromagnetic layer 21 and the second ferromagnetic layer 22 when the thickness $T_{71b}$ of the second side shield layer 71b became fluctuated without pinning the angles $\theta_{21}$ and $\theta_{22}$ of the magnetizations 21a and 22a of the first ferromagnetic layer 21 and the second ferromagnetic layer 22, a simulation analysis experiment (calculation of an angle of magnetization by LLG simulation) was conducted.

In the MR element 1 used in this simulation analysis experiment, the first upper shield layer 31, the second upper shield layer 32 and the side shield layer 7 were regarded as magnetization pinned layers where the angles $\theta_3$ and $\theta_7$ of the magnetizations 31a, 32a and 7a were pinned to 68.3 degrees. Further, the first lower shield layer 41 and the second lower shield layer 42 were regarded as magnetization pinned layers where the angle $\theta_4$ of the magnetizations 41a and 42a was pinned at 45 degrees, and their magnetizations 41a and 42a were in an antiparallel state to each other. Furthermore, the thickness $T_{71a}$ (dimension in Z direction) of the first side shield 71a was set at 7.0 nm, and dimensions of each of the other layers constituting the MR element 1 were set at the same as each layer of the MR element 1 of Experimental example 1.

Figure 21:
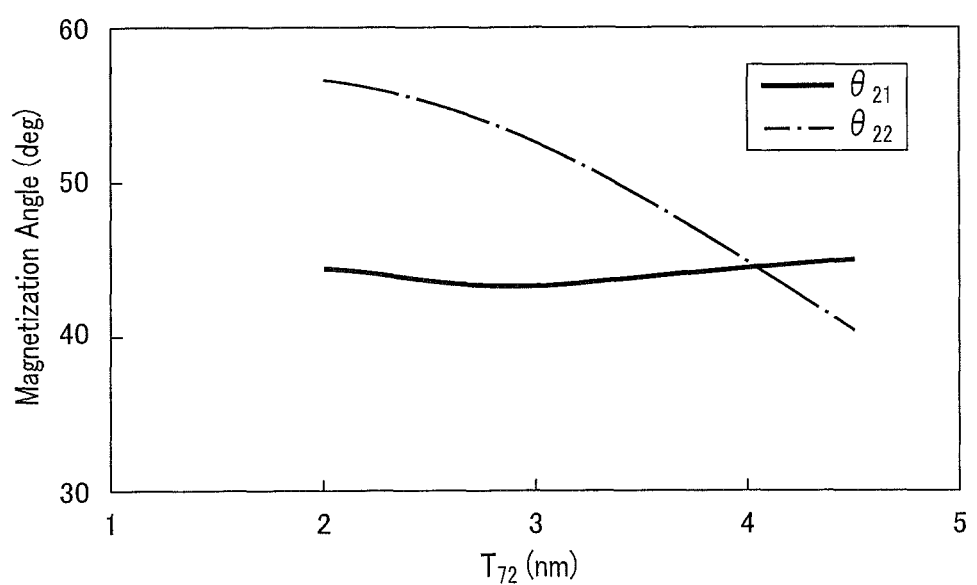
FIG. 21 is a graph showing a simulation result in Experimental Example 3.
Figure 22:
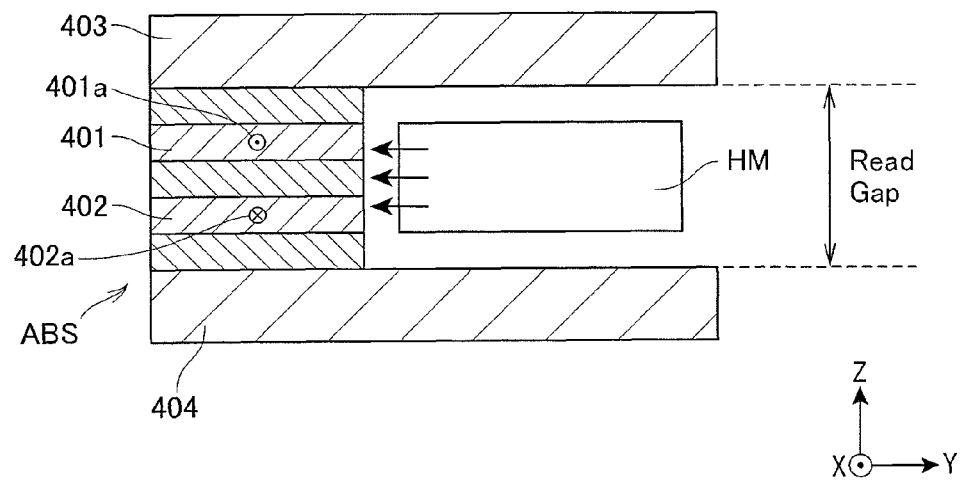
FIG. 22 is a cross-sectional view in a plane that is orthogonal to ABS, schematically showing an MR element of the prior art.
Figure 23:
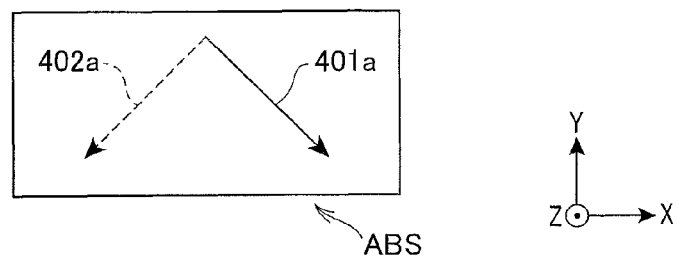
FIG. 23 is a model diagram showing an initial magnetization state in two ferromagnetic layers of the MR element of the prior art.

A graph showing a result of this simulation analysis experiment is shown in FIG. 21. According to the graph shown in FIG. 21, it was confirmed that the angle $\theta_{22}$ of the magnetization 22a of the second ferromagnetic layer 22 would be controllable at approximately 45 degrees without applying a bias magnetic field to the second ferromagnetic layer 22 from the side shield layer 7 by setting the thickness $T_{71b}$ (dimension in Z direction) of the second side shield layer 71b at 1 nm to 10 nm, more preferably at 2 nm to 4.5 nm, and particularly preferably at 3.96 nm.

The present invention is utilizable for industries of magnetic disk apparatus including the MR element for reading the intensity of a magnetic field of a magnetic recording medium as a signal.

The invention claimed is:
1. A magnetoresistive effect element (MR element), comprising a magnetoresistive effect part (MR part), an upper shield layer and a lower shield layer that are lamination-formed so as to interpose the MR part between the upper and lower shield layers, having a current-perpendicular-to-plane (CPP) structure in which a sense current is applied in the lamination direction, wherein
the MR element further has side shield layers formed with an insulating layer between the side shield layers and the lower shield layer so as to interpose the MR part between the side shield layers in a track width direction when viewed from a medium opposing surface of the MR element;
the MR part comprises a nonmagnetic intermediate layer, a first ferromagnetic layer and a second ferromagnetic layer to be lamination-formed so as to interpose the nonmagnetic intermediate layer between the first and second ferromagnetic layers;
each of the upper shield layer and the lower shield layer has an inclined magnetization structure of which its magnetization is inclined relative to the track width direction;
the side shield layers are magnetically coupled with the upper shield layer, respectively;
the second ferromagnetic layer is indirectly magnetically coupled with the lower shield layer via an exchange-coupling functional gap layer positioned between the second ferromagnetic layer and the lower shield layer;
the side shield layer is configured to be able to apply a bias magnetic field to at least the first ferromagnetic layer; and
a magnetization of the first ferromagnetic layer and a magnetization of the second ferromagnetic layer are configured to be substantially orthogonalized.
2. The MR element according to claim 1, wherein
the magnetization of the side shield layers is inclined from at 15 degrees to 75 degrees relative to the track width direction.
3. The MR element according to claim 2, wherein
the magnetization of the lower shield layer is inclined from at 15 degrees to 75 degrees relative to the track width direction.
4. The MR element according to claim 1, wherein
the side shield layer has a lamination structure with N layers (N is integer, 2 or greater) that is from a first side shield layer positioned at the upper shield layer side to an Nth side shield layer positioned at the lower shield layer side, and an exchange-coupling layer that is positioned between an (M−1)th side shield layer (M is integer between 2 and N) and an Mth side shield layer;
the (M−1)th side shield layer and the Mth side shield layer are indirectly magnetically coupled with each other via the exchange-coupling functional layer;
the first side shield layer is magnetically coupled with the upper shield layer; and
a thickness from the second side shield layer to the Nth side shield layer is within 1 nm to 10 nm.
5. The MR element according to claim 1, wherein
at least either of the upper shield layer or the lower shield layer comprises
a nonmagnetic layer,
a first shield layer and
a second shield layer that are lamination-formed so as to interpose the nonmagnetic layer between the first and second shield layers; and
the first shield layer and the second shield layer are exchange-coupled via the nonmagnetic layer so that magnetizations of the first shield layer and the second shield layer are inclined relative to the track width direction, respectively, and are antiparallel to each other.
6. The MR element according to claim 1, wherein
the exchange-coupling functional gap layer sequentially comprises, from the lower shield layer side, an exchange-coupling transmitting layer, a gap adjustment layer and an exchange-coupling adjustment layer.
7. The MR element according to claim 1, wherein
the exchange-coupling functional gap layer sequentially comprises, from the lower shield layer side, a first exchange-coupling transmitting layer, a first gap adjustment layer, a second exchange-coupling transmitting layer, a second gap adjustment layer and an exchange-coupling adjustment layer.

8. The MR element according to claim 1, wherein
the MR element is formed between an upper antiferromagnetic body layer adjacent to the upper shield layer and a lower antiferromagnetic body layer adjacent to the lower shield layer from top and bottom,
blocking temperature of an antiferromagnetic material constituting the lower antiferromagnetic body layer is higher than that of an antiferromagnetic material constituting the upper antiferromagnetic body layer.

9. The MR element according to claim 1, wherein
a bias magnetic field application part that applies a bias magnetic field to the first ferromagnetic layer and the second ferromagnetic layer is not established at the back side of the MR part when viewed from the medium opposing surface side of the MR element.

10. A thin film magnetic head, comprising:
a medium opposing surface that is opposed to a recording medium; and
the MR element according to claim 1 arranged in the vicinity of the medium opposing surface in order to detect a signal magnetic field from the recording medium.

11. A head gimbal assembly (HGA), comprising:
a slider that includes the thin film magnetic head according to claim 10, and is arranged so as to be opposed to a recording medium, and
a suspension that elastically supports the slider.

12. A magnetic disk apparatus, comprising:
a slider that includes the thin film magnetic head according to claim 10, and is arranged so as to be opposed to a recording medium, and
a positioning device that supports the slider, and, that positions the slider relative to the recording medium.

* * * * *